(12) United States Patent

Khaderbad et al.

(10) Patent No.: US 12,648,192 B2

(45) Date of Patent: Jun. 2, 2026

---

(54) STACKED TRANSISTORS HAVING ISOLATION LAYERS BETWEEN EPITAXIAL STRUCTURES

(71) Applicant: Taiwan Semiconductor Manufacturing Company, Ltd., Hsinchu (TW)

(72) Inventors: Mrunal Abhijith Khaderbad, Hsinchu City (TW); Dhanyakumar Mahaveer Sathaiya, Hsinchu (TW); Huicheng Chang, Tainan City (TW); Ko-Feng Chen, Hsinchu City (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/361,574

(22) Filed: Jul. 28, 2023

(65) Prior Publication Data

US 2023/0378257 A1 Nov. 23, 2023

Related U.S. Application Data

(62) Division of application No. 17/097,959, filed on Nov. 13, 2020, now Pat. No. 11,798,985.

(51) Int. Cl.
*H10D 62/10* (2025.01)
*H10D 30/01* (2025.01)
(Continued)

(52) U.S. Cl.
CPC ......... *H10D 62/116* (2025.01); *H10D 30/024* (2025.01); *H10D 30/62* (2025.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 10,090,193 B1 * 10/2018 Chanemougame .......................... H01L 21/823821
10,256,158 B1 4/2019 Frougier et al.
(Continued)

*Primary Examiner* — Younes Boulghassoul

(74) *Attorney, Agent, or Firm* — Sterne, Kessler, Goldstein & Fox P.L.L.C.

(57) ABSTRACT

The present disclosure is directed to a structure including isolation structures between source/drain (S/D) epitaxial structures of stacked transistor structures and a method for fabricating the structure. The method includes depositing an oxygen-free dielectric material in an opening over a first epitaxial structure, where the oxygen-free dielectric material covers top surfaces of the first epitaxial structure and sidewall surfaces of the opening. The method also includes exposing the oxygen-free dielectric material to an oxidizing process to oxidize the oxygen-free dielectric material so that the oxidizing process does not oxidize a portion of the oxygen-free dielectric material on the first epitaxial structure. Further, the method includes etching the oxidized oxygen-free dielectric material and forming a second epitaxial layer on the oxygen-free dielectric material not removed by the etching to substantially fill the opening.

20 Claims, 16 Drawing Sheets

(51) Int. Cl.

| | |
|---|---|
| *H10D 30/62* | (2025.01) |
| *H10D 30/67* | (2025.01) |
| *H10D 84/01* | (2025.01) |
| *H10D 84/03* | (2025.01) |
| *H10D 84/85* | (2025.01) |
| *H10D 88/00* | (2026.01) |
| *H10P 14/60* | (2026.01) |

(52) U.S. Cl.
CPC ..... *H10D 30/6735* (2025.01); *H10D 30/6757* (2025.01); *H10D 84/0188* (2025.01); *H10D 84/0193* (2025.01); *H10D 84/038* (2025.01); *H10D 84/85* (2025.01); *H10D 84/853* (2025.01); *H10D 84/856* (2025.01); *H10D 88/00* (2025.01); *H10D 88/01* (2025.01); *H10P 14/6522* (2026.01); *H10D 84/017* (2025.01)

(58) Field of Classification Search
CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 27/092; H01L 27/0922; H01L 21/823834; H01L 21/823807; H01L 21/823828; H01L 21/82385; H01L 21/82382; H01L 29/0649; H01L 29/0653; H01L 21/823481; H01L 21/823878; H01L 27/0688; H01L 21/8221; H01L 21/76224; H01L 21/76229; H01L 21/76232; H10B 12/36; H10B 12/056; H10D 84/0158; H10D 84/0193; H10D 84/834; H10D 84/853; H10D 86/011; H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 62/115; H10D 62/116; H10D 84/0151; H10D 84/0153; H10D 84/0188; H10D 30/0243; H10D 62/151; H10D 62/021; H10D 84/013; H10D 84/0133; H10D 84/017; H10D 30/6713; H10D 30/0223; H10D 30/797; H10D 84/0165–0195; H10D 84/85–859; H10D 88/00; H10D 88/01; H10D 84/856

See application file for complete search history.

(56) References Cited

U.S. PATENT DOCUMENTS

| | | | | |
|---|---|---|---|---|
| 2020/0105751 A1* | 4/2020 | Dewey | ................ | H01L 21/8256 |
| 2020/0105891 A1* | 4/2020 | Lilak | ............... | H01L 21/823864 |
| 2020/0294969 A1 | 9/2020 | Rachmady et al. | | |
| 2021/0104523 A1* | 4/2021 | Fulford | ................ | H01L 29/775 |
| 2021/0202500 A1 | 7/2021 | Chanemougame et al. | | |
| 2021/0210601 A1 | 7/2021 | Pidin | | |
| 2022/0020646 A1* | 1/2022 | Lin | ..................... | H10D 84/0167 |
| 2022/0109046 A1 | 4/2022 | Hong et al. | | |

* cited by examiner

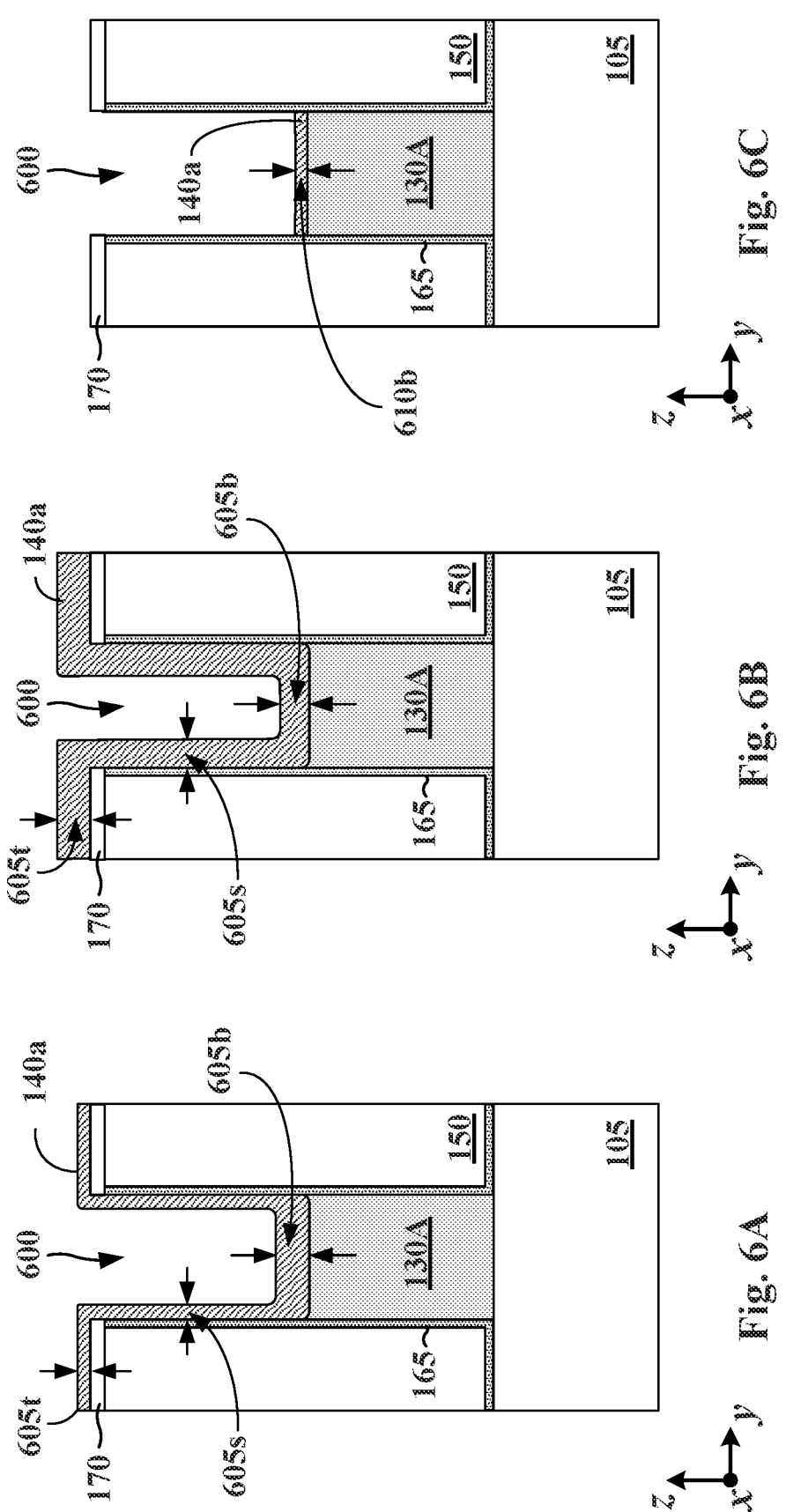

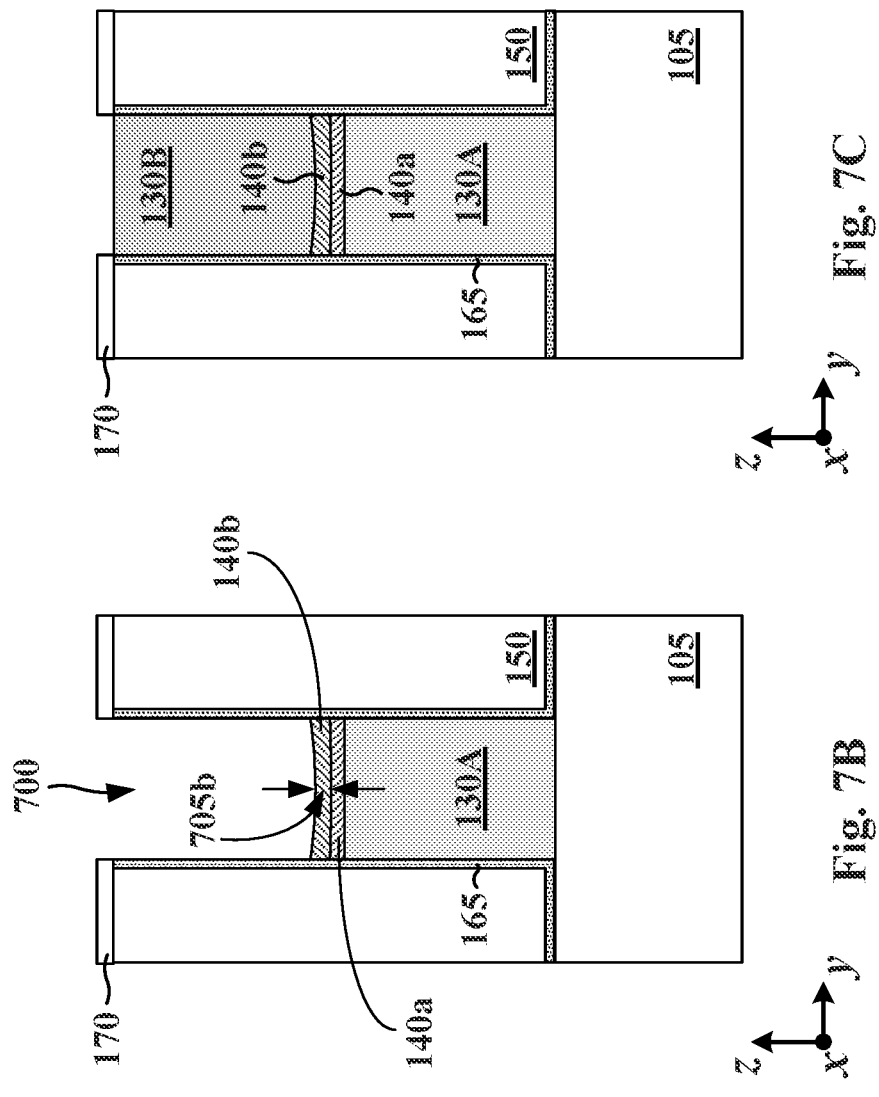
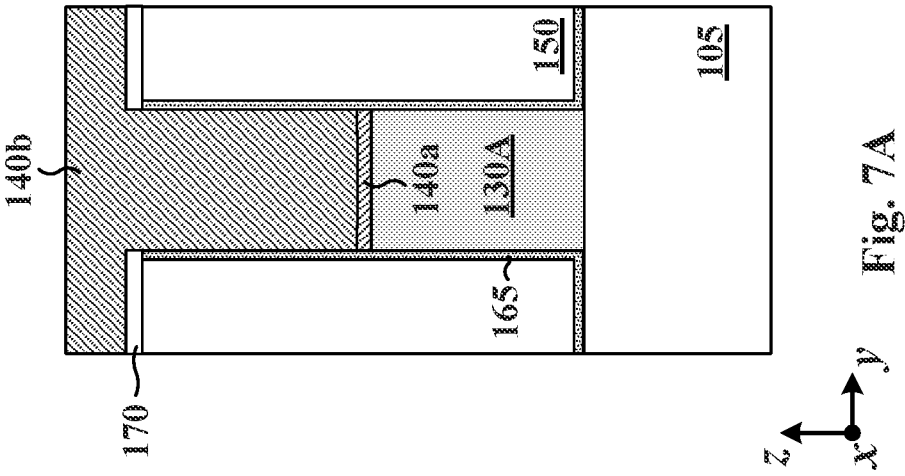

800

Deposit an oxygen-free, first dielectric layer on an epitaxial structure of a first transistor — 805

Oxidize a portion of the oxygen free, first dielectric layer — 810

Etch the oxidized portion of the first dielectric layer — 815

A

800

A

Deposit a second dielectric layer on the etched first dielectric layer — 820

Oxidize a portion of the second dielectric layer — 825

Etch the oxidized portion of the second dielectric layer — 830

Form an epitaxial structure of a second transistor on the second dielectric layer — 835

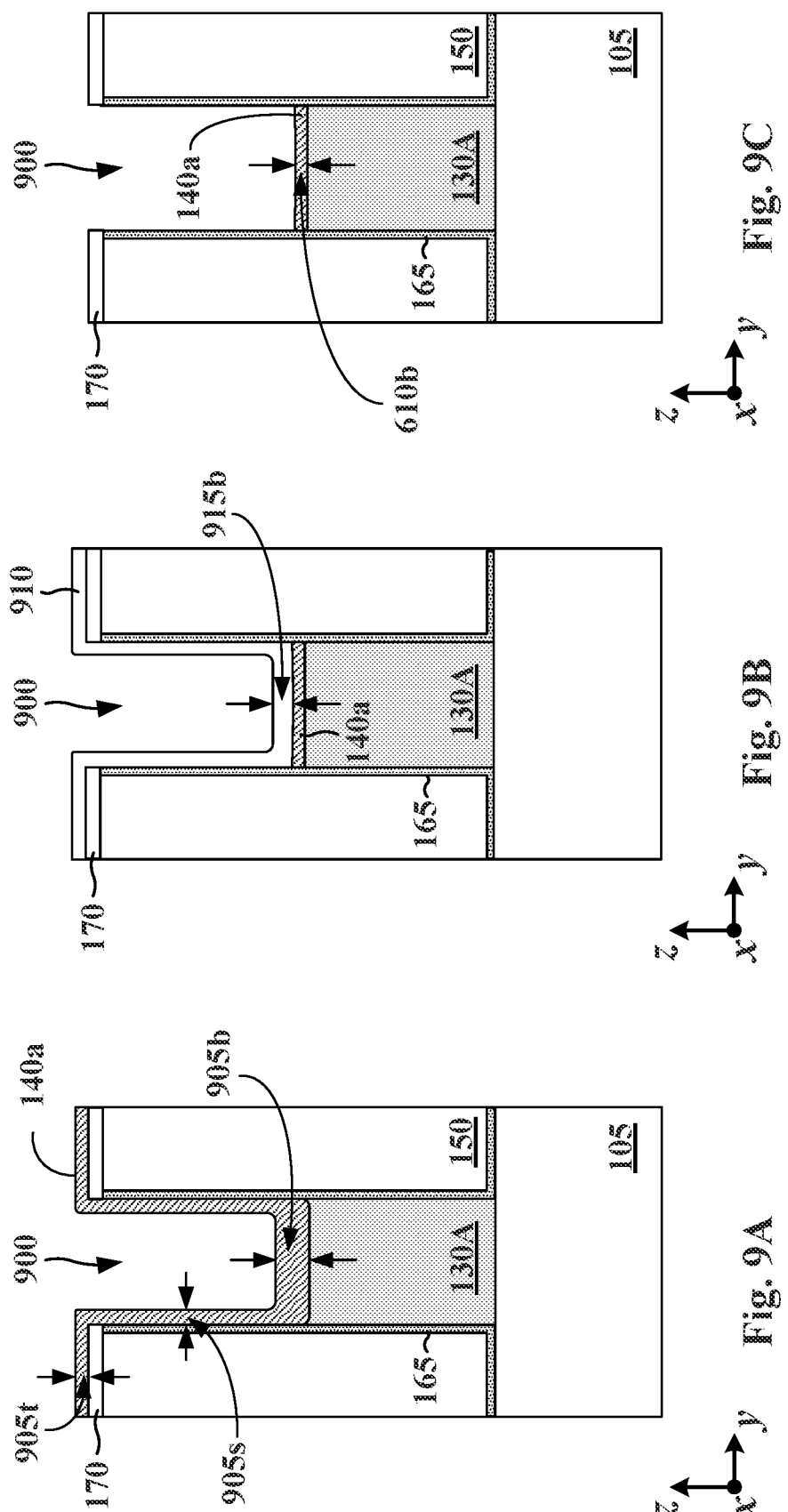

STACKED TRANSISTORS HAVING ISOLATION LAYERS BETWEEN EPITAXIAL STRUCTURES

CROSS-REFERENCE TO RELATED APPLICATIONS

This application a divisional of U.S. Non-provisional patent application Ser. No. 17/097,959, titled "Methods for Manufacturing Isolation Layers in Stacked Transistor Structures," filed on Nov. 13, 2020, which is incorporated herein by reference in its entirety.

BACKGROUND

The limitations of feature size scaling have spearheaded the exploration of new device architectures from fin field-effect transistors (finFETs) to gate-all-around (GAA) FETs. GAA FETs realize active area gains by vertical stacking nanostructures in the form of nanosheets or nanowires. However, GAA FETs may become susceptible to the limitations of scaling.

BRIEF DESCRIPTION OF THE DRAWINGS

Aspects of the present disclosure are best understood from the following detailed description when read with the accompanying figures.

FIGS. 6A-6C and 7A-7C are cross-sectional views of intermediate structures during the fabrication of bilayer isolation structures in CFETs, in accordance with some embodiments.

FIGS. 9A-9C, 10A, 10B, 11A, 11B, and 12 are cross-sectional views of intermediate structures during the fabrication of bilayer isolation structures in CFETs, in accordance with some embodiments.

DETAILED DESCRIPTION

Figures 1A, 1B:
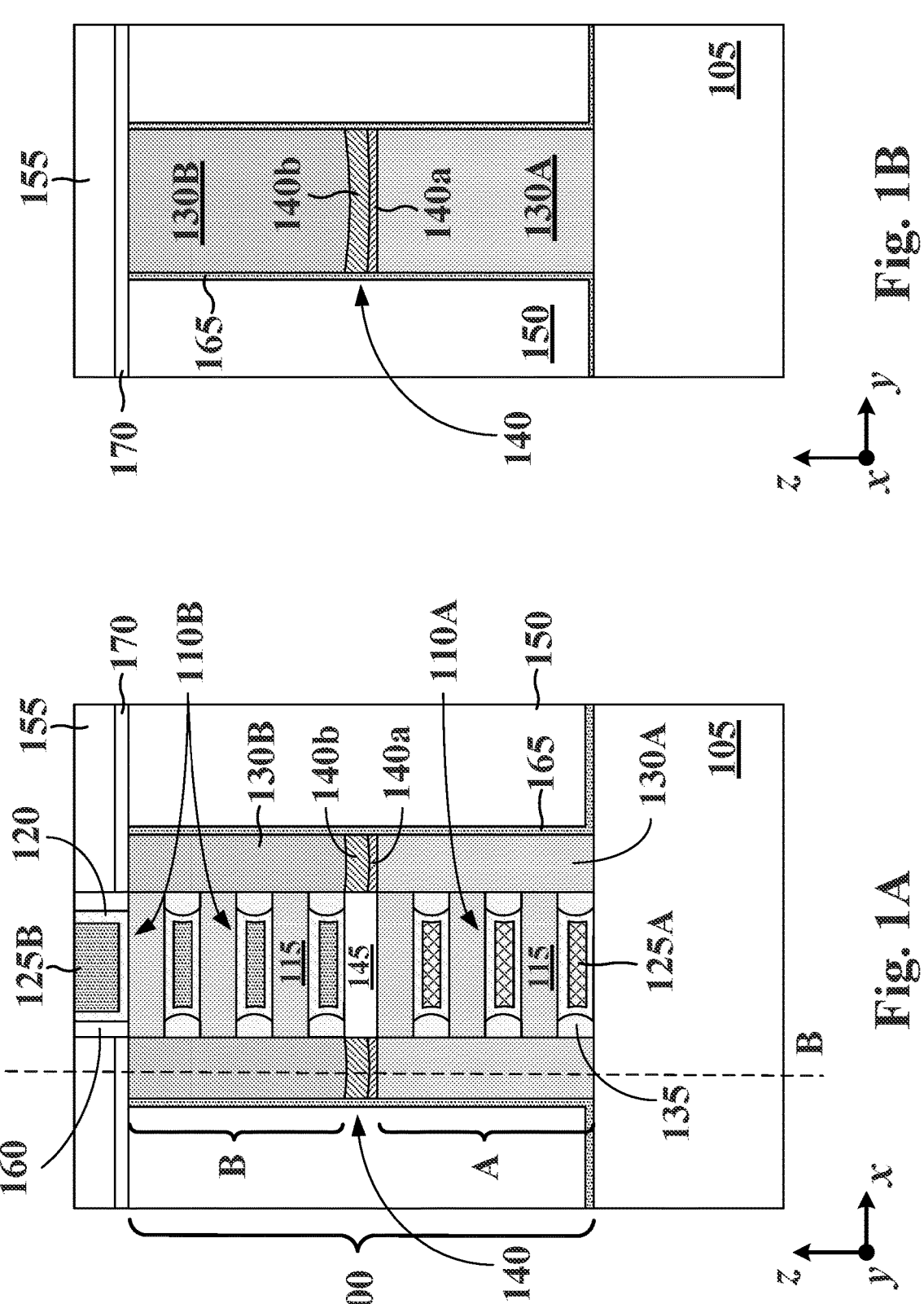
FIGS. 1A, 1B, 2A, 2B, 3A, and 3B are cross-sectional views of complementary field effect transistors (CFETs) with an isolation structure bilayer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Complementary FETs (CFETs) are types of gate-all-around (GAA) transistors. In GAA field-effect transistors (FETs), p-type or n-type nanostructures, such as nano-sheet (NS) or nano-wires (NW), are vertically stacked to form a single p-type or n-type GAA FET. P-type and n-type GAA FETs are formed on the same horizontal plane over a substrate and are separated by isolation structures. In contrast, CFETs are fabricated by vertically stacking a p-type GAA FET on an n-type GAA FETs or an n-type GAA FET on a p-type GAA FET. This stacking configuration of n- and p-type GAA FETs in a single structure eliminates the need for an n-to-p separation, reduces the active area footprint, and increases the transistor density within a chip. This stacking concept is not limited to GAA FETs; for example, CFETs can be formed with finFET devices or with a combination of GAA FETs and finFETs.

The fabrication and integration challenges faced in the formation of CFETs devices include, but are not limited to, the proper isolation of the source/drain (S/D) epitaxial structures between the stacked transistors. The embodiments described herein are directed to methods for the fabrication of isolation structures between the S/D epitaxial structures of the vertically stacked transistors in the CFET structure. In some embodiments, the isolation structures described herein are applicable to CFET devices that include GAA FETs or a combination of GAA FETs and finFETs. In some embodiments, the isolation structures include a stack of an oxygen-free bottom layer deposited directly on the S/D epitaxial structures of the bottom FET and a low-k top layer formed on the oxygen-free bottom layer. The S/D epitaxial structures of the upper FET are formed directly on the low-k top layer of the isolation structure. In some embodiments, the fabrication of the isolation structures includes a deposition process followed by a dry etching process. In some embodiments, the fabrication of the isolation structures includes a deposition process, a post-deposition treatment, and a wet etching process. In some embodiments, the isolation structures include a single low-k, oxygen-free layer interposed between the S/D epitaxial structures of the upper and bottom FETs. In some embodiments, the isolation structures include one or more nitride-based dielectrics.

According to some embodiments, FIG. 1A is a cross-sectional view of a CFET structure 100. In some embodiments, CFET structure 100 includes GAA-FETs A and B, which are vertically stacked on top of each other over a substrate 105. In some embodiments, GAA-FETs A and B are complementary transistors—e.g., transistor of opposite type. This means that if GAA-FET A is an n-type transistor (NFET), GAA-FET B is a p-type transistor (PFET). Similarly, if GAA-FET A is a PFET, GAA-FET B is an NFET. Each of GAA-FETs A and B includes a gate structure, such as gate structures 110A and 110B whose layers surround NS or NW layers 115 as shown in FIG. 1A. In some embodiments, gate structure 110A can be further disposed between an isolation oxide layer 145 (discussed below) and a topmost NW layer 115 of GAA-FET A (this embodiment is not shown in FIG. 1A). By way of example and not limitation, each gate structure 110A and 110B includes a similar dielectric stack 120 and respective gate electrodes, such as gate electrodes 125A and 125B. In some embodiments, dielectric stack 120 includes one or more dielectric layers, such interfacial layers and high-dielectric constant (high-k) layers (e.g., hafnium-based dielectrics). In some embodiments, gate electrodes 125A and 125B can be different from each other and include one or more capping layers, work function metallic layers, and one or more metal fill layers.

In addition, GAA-FETs A and B include S/D epitaxial structures 130A and 130B, which are in contact with respective NS or NW layers 115. Further, S/D epitaxial structures 130A and 130B are electrically isolated from respective gate structures 110A and 110B by spacer structures 135, which include a silicon-nitride based dielectric. According to some embodiments, S/D epitaxial structures 130A and 130B are vertically isolated from each other by isolation structures 140, which further include a first dielectric layer 140a and a second dielectric layer 140b. In some embodiments, first dielectric layer 140a is an oxygen-free liner layer with a thickness between about 2 nm and about 4 nm. In some embodiments, first dielectric layer 140a includes silicon nitride (SiN) deposited with a plasma-enhanced chemical vapor deposition (PECVD) process or a plasma-enhanced atomic layer deposition (PEALD) process. In some embodiments, second dielectric layer 140b is an oxygen-containing dielectric with a dielectric constant (k-value) of about 3.9 or a low-k dielectric layer with a k-value less than about 3.9 (e.g., between about 1.5 and about 3.5). In some embodiments, second dielectric layer 140b is an oxide, which includes, for example, hydrogen. In some embodiments, second dielectric layer 140b is a nitride-based dielectric, which further includes silicon, carbon, oxygen, boron, or any combination thereof. By way of example and not limitation, second dielectric layer 140b can include silicon oxide ($SiO_2$), silicon carbon nitride (SiCN), silicon oxy-carbon nitride (SiCON), silicon boron carbon nitride (SiBCN), boron nitride (BN), or any suitable dielectric layer. In some embodiments, layer 140b is deposited with a CVD process, a PECVD process, or a PEALD process at a thickness between about 50 nm and about 100 nm.

In some embodiments, first dielectric layer 140a protects S/D epitaxial structures 130A from oxidation during the formation of second dielectric layer 140b. In some embodiments, a first dielectric layer 140a thinner than about 2 nm may not adequately protect S/D epitaxial structures from oxidation. On the other hand, a first dielectric layer 140a thicker than about 140b can increase the parasitic capacitance formed between the vertically stacked S/D epitaxial structures 130a and 130b, which is undesirable. Therefore, the thickness of first dielectric layer 140a can be selected to provide a balance between adequate oxygen barrier performance and desirable parasitic capacitance characteristics.

Other portions of GAA FETs A and B (e.g., gate structures 110A and 110B) are isolated from each other by an isolation oxide layer 145 having a thickness similar to the thickness of isolation structure 140 (e.g., the combined thickness of first and second dielectric layers 140a and 140b) or thicker. For example, isolation oxide layer 145 can have a thickness between about 100 nm and about 200 nm. In some embodiments, isolation oxide layer 145 is a $SiO_2$ layer or a $SiO_2$-based layer with a thickness adjusted to prevent cross talk between GAA FETs A and B.

In some embodiments, the thickness of isolation structures 140 is adjusted based on the spacing between S/D epitaxial structures 130A and 130B to prevent cross talk between GAA FETs A and B. In some embodiments, the thickness of first dielectric layer 140a can be fixed between about 2 nm and about 4 nm, while the thickness of second dielectric layer 140b can be adjusted to fill the space between S/D epitaxial structures 130A and 130B.

In some embodiments, CFET structure 100 is embedded in dielectric layers 150 and 155 disposed on substrate 105. By way of example and not limitation, dielectric layers 150 and 155 can be interlayer dielectric (ILD) layers. In some embodiments, each of dielectric layers 150 and 155 includes a stack of one or more dielectric layers not shown in FIG. 1A. By way of example and not limitation, dielectric layers 150 and 155 can be made from different dielectric materials and can be deposited with different deposition methods. By way of example and not limitation, dielectric layers 150 and 155 include a silicon oxide dielectric enriched with hydrogen, carbon, nitrogen, or any combinations thereof. In some embodiments, dielectric layers 150 and 155 electrically isolate CFET structure 100 from neighboring CFET structures not shown in FIG. 1A.

In some embodiments, CFET structure 100 includes additional isolation layers, such as gate spacers 160, S/D capping layers 165, and etch stop layer (ESL) 170. In some embodiments, gate spacers 160 are formed to cover sidewall surfaces of gate structure 110B and top surface portions of NS or NW layer 115. S/D capping layers 165 and ESL 170 are formed to cover surfaces of S/D epitaxial structures 130A and 130B as shown in FIG. 1A. In some embodiments, gate spacers 160 and ESL 170 may form a single layer. In some embodiments, gate spacers 160 may include one or more layers (e.g., two layers) where one of the one or more layers forms ESL 170. By way of example and not limitation, gate spacers 160, S/D capping layers 165, and ESL 170 include a silicon nitride (SiN)-based dielectric, such as silicon nitride (SiN), SiCN, and the like.

According to some embodiments, ESL 170 facilitates the formation of S/D conductive structures (e.g., S/D contacts) on a top surface of S/D epitaxial structures 130B—e.g., adjacent to gate structure 110B. In some embodiments, S/D conductive structures for S/D epitaxial structures 130A are formed from the backside (e.g., from a bottom surface) of substrate 105. The S/D conductive structures for S/D epitaxial structures 130A and 130B are not shown in FIG. 1A for simplicity.

According to some embodiments, FIG. 1B is a cross-sectional view of CFET structure 100 along the y-z plane, parallel to cut line AB shown in FIG. 1A. In FIG. 1B, other portions of GAA FETs A and B along the x-direction—such as gate structures 110A/B, NS or NW layers 115—are behind S/D epitaxial structures 130A/B and therefore not visible. Accordingly, FIG. 1B shows side surfaces of S/D epitaxial structures 130A and 130B, as well as side surfaces of isolation structure 140.

Figures 2A, 2B:
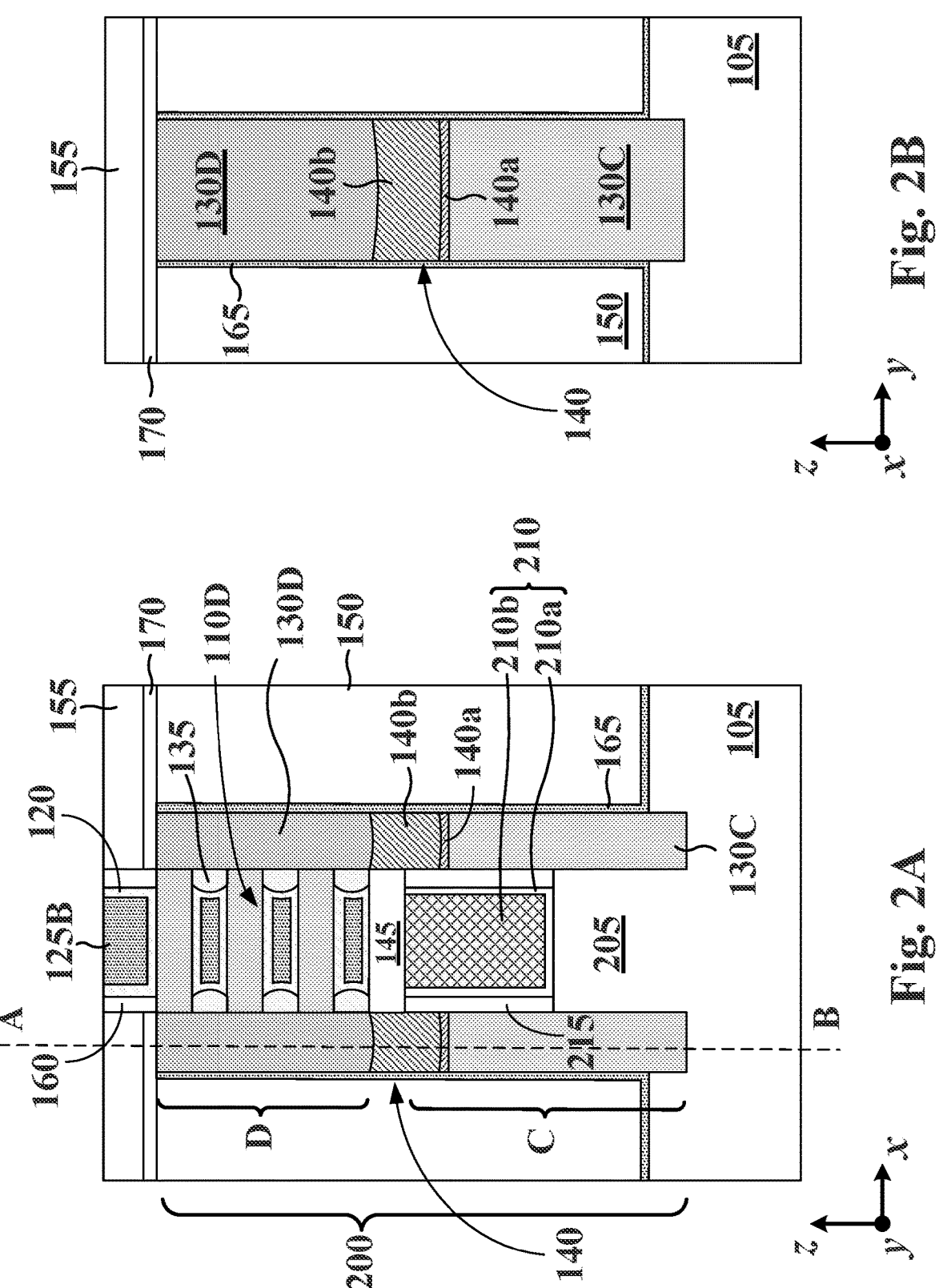

In some embodiments, FIG. 2A is a cross-sectional view of a CFET structure 200. CFET structure 200 includes a GAA FET D stacked on top of a finFET C. In some embodiments, finFET C and GAA FET D are complementary transistors—e.g., transistors of opposite type. For example, if finFET C is an NFET, GAA FET D is a PFET; and if finFET C is a PFET, GAA FET D is an NFET.

In some embodiments, GAA FET D has similar components to GAA FETs A and B described above. For example, GAA FET D includes a gate structure 110D surrounding NS or NW layers 115, a pair of S/D epitaxial structures 130D, and spacer structures 135. FinFET C is formed on a fin structure 205 disposed on substrate 105 as shown in FIG. 2A. In some embodiments, fin structure 205 is formed by patterning substrate 105. Alternatively, fin structure 205 can be grown on substrate 105 and subsequently patterned. FinFET C includes S/D epitaxial structures 130C formed on recessed portions of fin structure 205 and a gate structure 210 formed perpendicular to fin structure 205 (e.g., along the y-direction) and covers top and sidewall surfaces of fin structure 205. By way of example and not limitation, gate structure 210 includes gate dielectric 210a and gate electrode 210b, both of which may include one or more layers. In addition, gate structure 210 is electrically isolated from S/D epitaxial structures 130C by gate spacers 215, which provide structural support during the formation of gate structure 210.

Similar to CFET structure 100 shown in FIG. 1A, the transistors in CFET structure 200 are isolated from each other by isolation structures 140 and isolation oxide layer 145. Similar to isolation structures 140 of CFET structure 100, isolation structures 140 in CFET structure 200 include first and second dielectric layers 140a and 140b. In some embodiments, isolation structures 140 in CFET structure 200 can be thicker than isolation structures 140 in CFET structure 100 due to (i) a larger separation between S/D epitaxial structures 130C and 130D or (ii) a larger spacing required to pattern gate structure 210. In some embodiments, the thickness of second dielectric layer 140b in CFET structure 200 can be adjusted to compensate for the additional separation between S/D epitaxial structures 130C and 130D. In some embodiments, the thickness of second dielectric layer 140b in CFET structure 200 ranges from about 50 nm to about 100 nm, while the thickness of first dielectric layer 140a in CFET structure 200 ranges from about 2 nm to about 4 nm.

According to some embodiments, FIG. 2B is a cross-sectional view of CFET structure 200 along the y-z plane, parallel to cut line AB shown in FIG. 2A. In FIG. 2B, other portions of finFET C and GAA FET D along the x-direction (e.g., gate structures 110D and 210, NS or NW layers 115, fin structure 205, etc.) are behind S/D epitaxial structures 130C/D and therefore not visible. Accordingly, FIG. 2B shows side surfaces of S/D epitaxial structures 130C and 130D, as well as side surfaces of isolation structure 140.

Figures 3A, 3B:
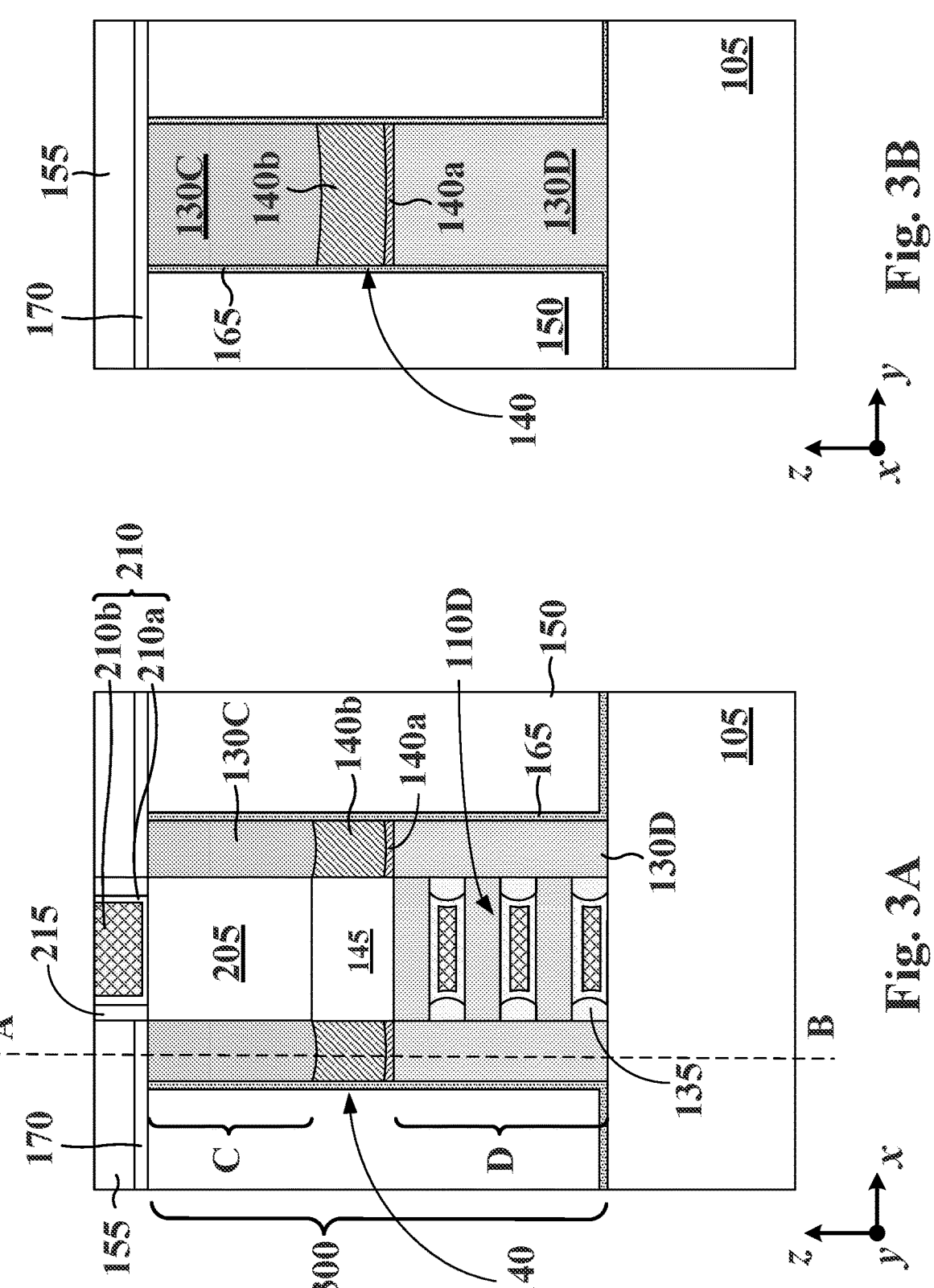

In some embodiments, FIG. 3A is a cross-sectional view of a CFET structure 300. For example, in CFET structure 300, finFET C is disposed on top of GAA FET D instead of the other way around as in CFET structure 200. FIG. 3B is a cross-sectional view of CFET structure 300 along the y-z plane parallel to cut line AB shown in FIG. 3A. FIG. 3B shows side surfaces of S/D epitaxial structures 130C and 130D, as well as side surfaces of isolation structure 140.

In some embodiments, the thickness of isolation structures 140 in CFET structure 300 can be different from that in CFET structure 200 based on the separation between S/D epitaxial structures 130C and 130D. As discussed above, the thickness of second dielectric layer 140b in isolation structure 140 can be adjusted to fill the space between S/D epitaxial structures 130C and 130D.

By way of example and not limitation, PFETs in CFET structures 100, 200, and 300 have S/D epitaxial structures with boron-doped (B-doped) silicon-germanium (SiGe:B) layers, B-doped germanium (Ge:B) layers, B-doped germanium-tin (GeSn:B) layers, or any combination thereof. NFETs in CFET structures 100, 200, and 300 have S/D epitaxial structures with arsenic (As)-doped silicon layers (Si:As), phosphorous (P)-doped silicon layers (Si:P), carbon-doped silicon layers (Si:C), or any combination thereof.

In some embodiments, the side profile of S/D epitaxial structures, shown in FIGS. 1B, 2B, and 3B, is not limited to a rectangular shape. For example, the side profile of S/D epitaxial structures shown in FIGS. 1B, 2B, and 3B can be diamond-shaped, a pentagon-shaped, or have any other shape based on the growth conditions of each S/D epitaxial structure. These other side profile shapes for S/D epitaxial structures 130A, B, C, and D are within the spirit and the scope of the disclosure.

In embodiments, substrate 105 and fin structures 205 shown in FIGS. 1A, 2A, and 3A include silicon (Si) or another elementary semiconductor, such as germanium (Ge). In some embodiments, substrate 105 and fin structures 205 include an alloy semiconductor, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, substrate 105 and fin structures 205 include any combination of the aforementioned materials. In some embodiments, substrate 105 and fin structures 205 are intrinsic (e.g., un-doped) or doped.

By way of example and not limitation, NS or NW layers 115 shown in FIGS. 1A, 2A, and 3A can include lightly doped or un-doped Si or SiGe. If lightly doped, the doping level of NS or NW layers 115 can be less than about $10^{13}$ atoms/cm$^3$.

In some embodiments, first dielectric layer 140a is similar in terms of material and thickness for isolation structures 140 shown in FIGS. 1A/B, 2A/B, and 3A/B. In some embodiments, second dielectric layer 140b is similar in terms of material, but may be different in terms of thickness, for isolation structures 140 shown in FIGS. 1A/B, 2A/B, and 3A/B. For example, the thickness of second dielectric layer 140b can be adjusted based on the spacing between the respective S/D epitaxial structures of the stacked transistors in each CFET structure, as discussed above. In some embodiments, first dielectric layer 140a is an oxygen-free dielectric and second dielectric layer 140b is an oxygen-containing dielectric with a lower dielectric constant (k-value) than first dielectric layer 140a.

Figures 4A, 4B:
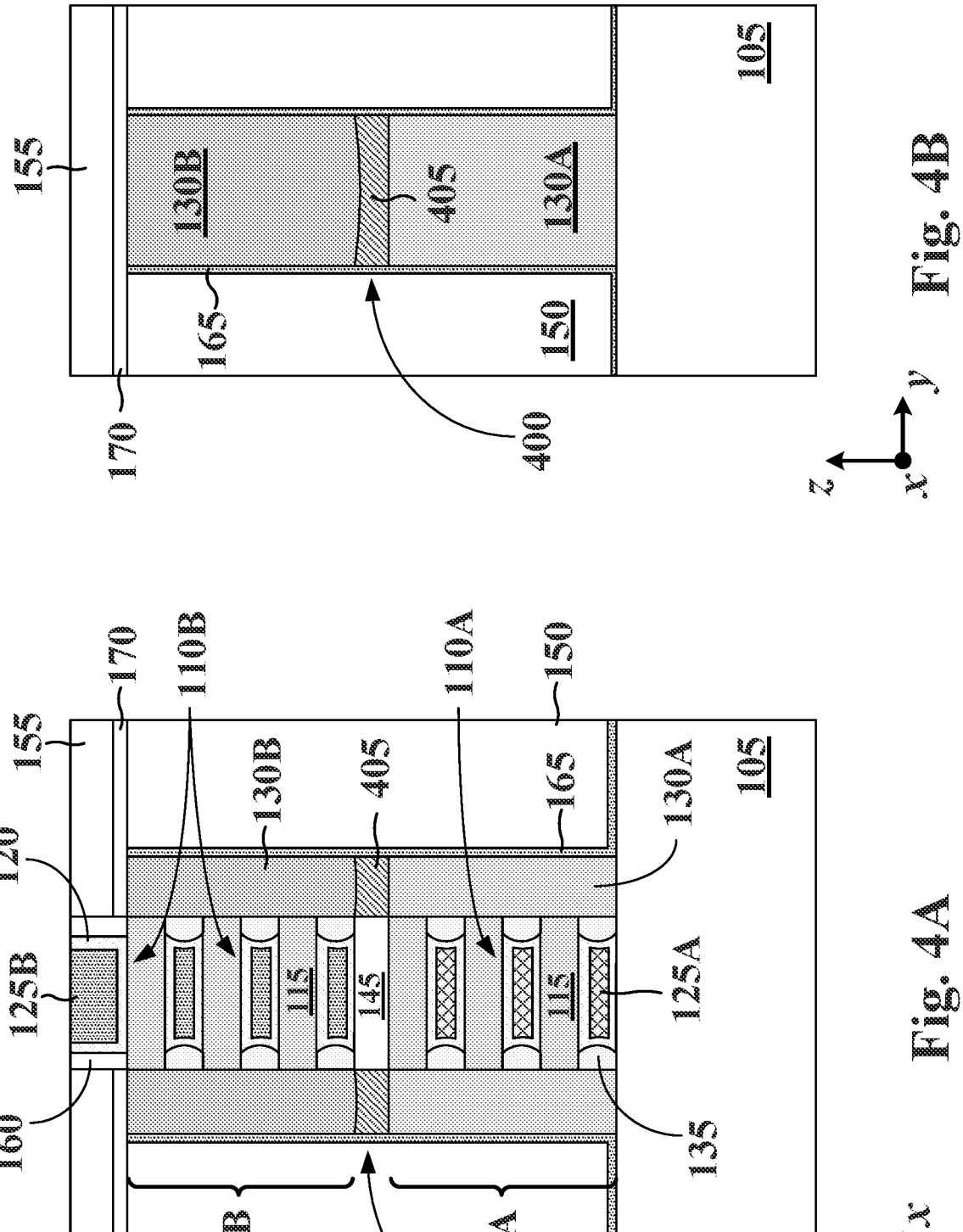
FIGS. 4A and 4B are cross-sectional views of CFETs with a single layer isolation structure, in accordance with some embodiments.

In some embodiments, first and second dielectric layers 140a and 140b can be replaced with a single oxygen-free, low-k, dielectric layer. For example, first and second dielectric layers 140a and 140b can be replaced by a single BN layer, SiCN layer, or a SiBCN layer. In some embodiments, FIGS. 4A and 4B are cross-sectional views of CFET structure 100 with single-layer isolation structures 400, which include a single oxygen-free, low-k, dielectric layer 405 as opposed to a stack having first and second dielectric layers 140a and 140b. In some embodiments, single-layer isolation structures 400 can be similarly applied to CFET structures 200 and 300 shown in FIGS. 2A/B and 3A/B. In some embodiments, the thickness of dielectric layer 405 is substantially similar to the combined thickness of first and second dielectric layers 140a and 140b shown in FIGS. 1A and 1B—e.g., between about 52 nm and about 104 nm. In some embodiments, gate structure 110A can be further disposed between isolation oxide layer 145 and a topmost NW layer 115 of GAA-FET A, where the thickness of dielectric layer 405 can be substantially similar to the combined thickness of first and second dielectric layers 140a and 140b shown in FIGS. 1A and 1B—e.g., between about 52 nm and about 154 nm.

Figure 5:
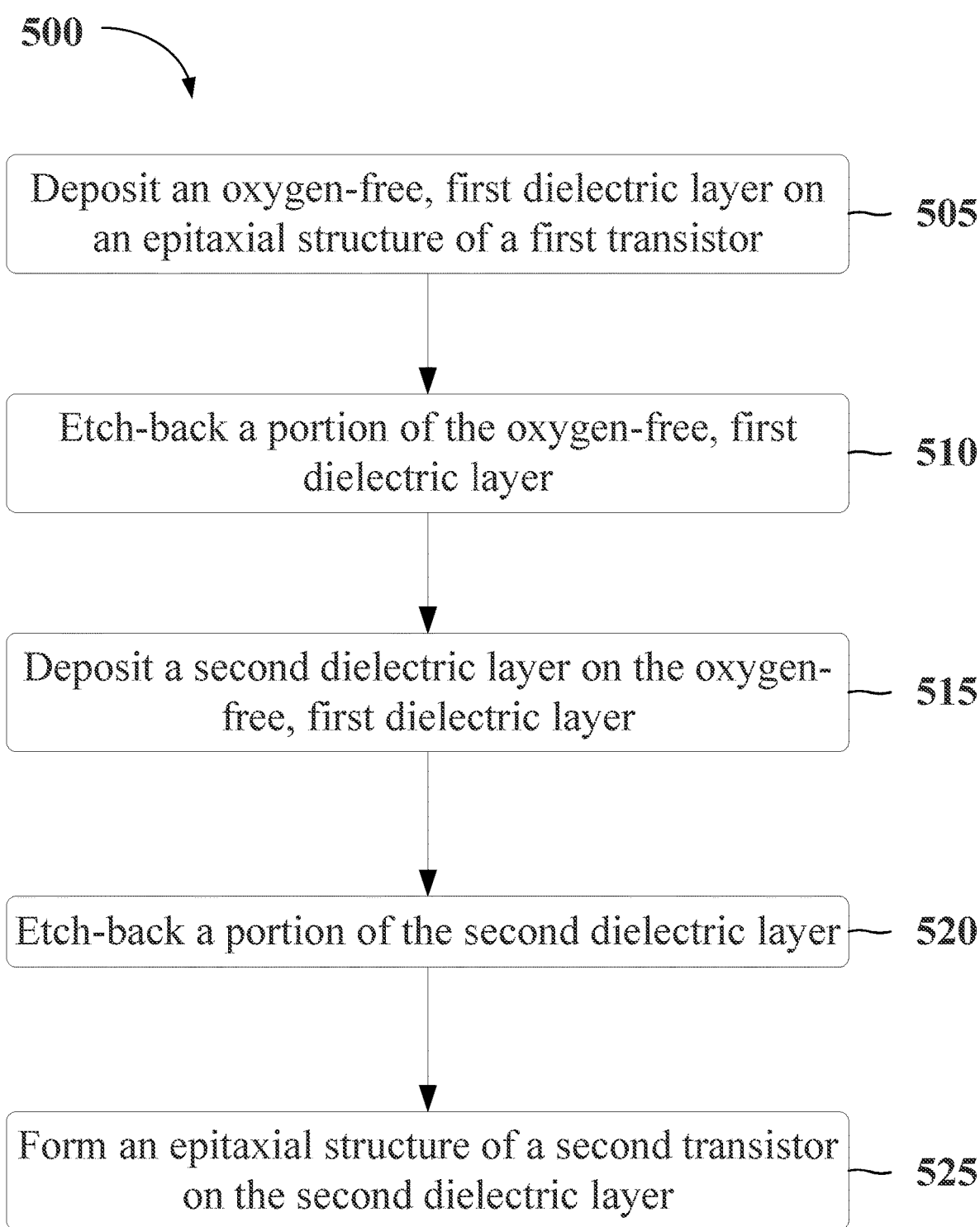
FIG. 5 is a flow chart of a fabrication method for the formation of bilayer isolation structures in CFETs, in accordance with some embodiments.

According to some embodiments, FIG. 5 is a flow chart of a fabrication method 500 for the formation of isolation structures 140 shown in FIGS. 1A/B, 2A/B, and 3A/B. Other fabrication operations can be performed between the various operations of method 500 and are omitted merely for clarity. This disclosure is not limited to this operational description and additional operations may be performed. Moreover, not all operations may be needed to perform the disclosure provided herein. Additionally, some of the operations may be performed simultaneously or in a different order than the ones shown in FIG. 5. In some embodiments, one or more other operations may be performed in addition to or in place of the presently described operations. For example purposes, method 500 will be described in the context of CFET structure 100 shown in FIGS. 1A and 1B. Based on the disclosure herein, method 500 is similarly applicable to CFET structures 200 and 300 shown in FIGS. 2A/B and 3A/B. For illustrative purposes, method 500 will be described using cross-sectional views parallel to the y-z plane, such as the view shown in FIG. 1B.

In some embodiments, method 500 begins after partial formation of a bottom transistor and before the formation of an upper transistor in the CFET structure. For example, and in referring to FIG. 1A, method 500 begins after the formation of a portion of GAA FET A—e.g., after the formation of S/D epitaxial structures 130A and before the formation of gate structure 110A and GAA FET B.

In referring to FIG. 5, method 500 begins with operation 505 and the process of depositing an oxygen-free, first dielectric layer (e.g., first dielectric layer 140a) on epitaxial structure 130A of a first transistor, such as GAA FET A. In some embodiments, FIG. 6A is a side cross-sectional view of S/D epitaxial structure 130A of GAA FET A after the deposition of first dielectric layer 140a according to operation 505. In some embodiments, first dielectric layer 140a is deposited in an opening 600 that exposes a top surface of S/D epitaxial structure 130A. In some embodiments, opening 600 is formed in dielectric layer 150 with its sidewalls formed by S/D capping layer 165. In some embodiments, ESL 170, dielectric layer 150, and S/D capping layer 165 are formed in earlier fabrication operations.

In some embodiments, first dielectric layer 140a is a SiN layer deposited with a non-conformal deposition process so that its bottom thickness 605b is greater than its sidewall thickness 605s and top thickness 605t. For example, 605b>605s, 605t. In some embodiments, 600s is greater than 605t (e.g, 605s>605t). In some embodiments, 605s is comparable to 605t (e.g., 605s is substantially equal to 605t). In some embodiments, 605s is thinner towards the top of opening 600 and thicker towards the bottom of opening 600. In some embodiments, 605b ranges from about 25 to about 100 nm, 605s ranges from about 10 nm to about 15 nm, and 605t ranges between about 5 nm and about 10 nm.

In some embodiments, first dielectric layer 140a is deposited with a conformal deposition process so that its bottom thickness 605b is comparable to its sidewall and top thickness 605s and 605t, respectively, as shown in FIG. 6B. For example, with a conformal deposition 605b is substantially equal to 605s, which is substantially equal to 605t, where 605b, 605s, and 605t range from about 25 nm and about 10 nm.

In some embodiments, first dielectric layer 140a is deposited with a plasma-assisted deposition method, such as a plasma-enhanced chemical vapor deposition (PECVD) process or a plasma-enhanced atomic layer deposition (PEALD) process. As discussed above, first dielectric layer 140a protects S/D epitaxial structures 130a from oxidation during the subsequent formation of second dielectric layer 140b in the event that second dielectric layer 140b contains oxygen. In some embodiments, the thickness of first dielectric layer 140a is adjusted so that, after a subsequent etching operation discussed below, the thickness of first dielectric layer 140a at the bottom of opening 600 (e.g., on S/D epitaxial structure 340A) is between about 2 nm and about 4 nm.

By way of example and not limitation, a non-conformal deposition can be achieved with the use of a growth inhibitor that selectively restricts the growth of first dielectric layer 140a on a top portion of opening 600 or with a deposition-etch-deposition (DED) approach, which selectively and intermittently removes deposited material from top portions of opening 600 during deposition.

In referring to FIG. 5, method 500 continues with operation 510 and the process of etching-back a portion of the oxygen-free, first dielectric layer 140a. In some embodiments, the etch-back process can be isotropic or anisotropic if first dielectric layer 140a is non-conformally deposited as shown in FIG. 6A. In some embodiments, the etch-back process is anisotropic if first dielectric layer 140a is conformally deposited as shown in FIG. 6B. In some embodiments, the etching back process selectively removes first dielectric layer 140a from dielectric layer 150, surfaces of ESL 170, and sidewall surfaces of opening 600 (e.g., top portions of S/D capping layer 165) as shown in FIG. 6C.

In some embodiments, the term "isotropic" as used herein refers to an etching process that has a substantially constant etching rate along the z-direction (e.g., at the top and bottom portions of opening 600). For example, an isotropic etching process removes (e.g., etches) substantially the same amount of material along from the top and bottom portions of opening 600. In some embodiments, the term "anisotropic" as used herein refers to an etching process that has a substantially varying etching rate along the z-direction. An anisotropic etching process removes (e.g., etches) more material from a top portion of opening 600 than from a bottom portion of opening 600. For example, the etching rate of an anisotropic etch-back process progressively decreases from the top to the bottom of opening 600.

In some embodiments, a wet etching process can be used to isotropically etch first dielectric layer 140a when, for example, first dielectric layer 140a is non-conformally deposited in opening 600 as shown in FIG. 6A. By way of example and not limitation, a wet etching chemistry can include phosphoric acid ($H_3PO_4$).

In some embodiments, a dry etching process can be used to anisotropically etch first dielectric layer 140a when, for example, first dielectric layer 140a is conformally or non-conformally deposited in opening 600 as shown in FIGS. 6A and 6B respectively. By way of example and not limitation, an anisotropic etching can be achieved when the etching gases of the dry etching process have a higher concentration towards a top portion of opening 600 compared to a bottom portion of opening 600. The aforementioned etching gas distribution results in a higher etching rate at the top of opening 600 and a lower etching rate at the bottom of opening 600. By way of example and not limitation, a drying etching chemistry can include fluorine-based gases, such as fluoromethane ($CH_3F$), tetrafluoromethane ($CF_4$), 1-fluorobutane ($C_4H_9F$), and combinations thereof.

In some embodiments, FIG. 6C shows the structures of FIGS. 6A and 6B after operation 510 described above. In some embodiments, a remaining (e.g., un-etched) bottom thickness 610b of first dielectric layer 140a is between about 2 nm and about 4 nm. As discussed above first dielectric layer 140a protects S/D epitaxial structures 130a from oxidation during the formation of second dielectric layer 140b in the event that second dielectric layer 140b contains oxygen. In some embodiments, first dielectric layers with a thickness less than about 2 nm fail to adequately protect S/D epitaxial structure 130A from oxidation. For example, first dielectric layers 140b thinner than about 2 nm can be permeable to oxygen atoms. On the other hand, a first dielectric layer with a thickness greater than about 4 nm increases the parasitic capacitances within the CFET structure. This is because the dielectric constant of SiN is about 7, which is substantially higher than that of $SiO_2$ (e.g., about 3.9). Therefore, thicker SiN layers contribute more to the parasitic capacitances. As a result, bottom thickness 610b of first dielectric layer 140a after operation 510 has to provide a balance between adequate oxygen barrier properties and acceptable parasitic capacitance.

In some embodiments, the etch-back process of operation 510 results in a top surface for first dielectric layer 140a that is curved (e.g., it is concave). For example, thickness 610b may not be uniform on S/D epitaxial structure 130A along the y-direction. More specifically, an edge thickness of first dielectric layer 140a adjacent to S/D capping layers 165 can be greater than a mid-point thickness of first dielectric layer 140a. According to some embodiments, the edge thickness of first dielectric layer 140a can be between about 1 nm and 2 nm thicker than the mid-point thickness of first dielectric layer 140a. In some embodiments, the edge thickness of first dielectric layer 140a can be about 50% larger than the mid-point thickness of first dielectric layer 140a.

In some embodiments, the etch-back process of operation 510 results in a top surface of first dielectric layer 140a that is substantially planar. For example, thickness 610b of first dielectric layer 140a is uniform over S/D epitaxial structure 130A in the x and y-directions—e.g., between about 2 nm and 4 nm.

In some embodiments, the etch-back process of operation 510 does not substantially etch ESL 170 and S/D capping layers 165. For example, the etch-back process can be configured to cease (e.g., endpoint) when first dielectric layer 140a is removed from top and sidewall surfaces of ESL 170 and upper sidewall surfaces of S/D capping layers 165. In some embodiments, the etch-back process is timed, end-pointed, or any combination thereof.

In referring to FIG. 5, method 500 continues with operation 515 and the process of depositing second dielectric layer 140b on the oxygen-free, first dielectric layer 140a. In some embodiments, second dielectric layer 140b is a $SiO_2$ layer that substantially fills opening 600. Second dielectric layer 140b can be deposited with any appropriate high-gap fill method, such as a flowable CVD process. According to some embodiments, FIG. 7A shows the structure of FIG. 6C after the deposition of second dielectric layer 140b according to operation 515.

In referring to FIG. 5, method 500 continues with operation 520 and the process of etching-back a portion of second dielectric layer 140b. In some embodiments, the etch-back process includes a wet etching process that isotropically removes second dielectric layer 140b from ESL 170 and from top sidewall portions of S/D capping layers 165 as shown in FIG. 7B. In some embodiments, an un-etched portion of second dielectric layer 140b remains on first dielectric layer 140a at the bottom of opening 700. In some embodiments, a thickness 705b of second dielectric layer 140b on first dielectric layer 140a at the bottom of opening 700 is between about 50 nm and about 100 nm. In some embodiments, thickness 705b is controlled by the etch-back process of operation 520 and can be adjusted based on the desired spacing of subsequently formed S/D epitaxial structures 130B over the underlying S/D epitaxial structures 130A as discussed above.

In some embodiments, the wet etching chemistry includes diluted hydrofluoric acid (DHF) with a water-to-HF ratio between about 100:1 and 500:1. The top surface of the etched second dielectric layer 140b can become concave, which in some embodiments is attributed to the etching characteristics of the wet etching process. For example, the edge thickness of second dielectric layer 140b adjacent to S/D capping layers 165 can be thicker than its mid-point thickness. In some embodiments, the edge thickness of second dielectric layer 140b is between about 3 nm and about 5 nm thicker than its mid-point thickness. For example, the edge thickness of second dielectric layer 140b can be between about 3% and about 10% thicker than its mid-point thickness.

In referring to FIG. 5, method 500 continues with operation 525 and the process of forming an epitaxial structure (e.g., S/D epitaxial structure 130B) of a second transistor (e.g., GAA transistor B shown in FIG. 1A) on second dielectric layer 140b. In some embodiments, S/D epitaxial structure 130B is a polycrystalline structure grown by CVD directly on second dielectric layer 140b. According to some embodiments, FIG. 7C shows the structure of FIG. 7B after operation 525.

In some embodiments, other fabrication operations, not described herein, are formed between operation 520 and 525. For example, other elements of GAA transistor B may be formed after operation 520 and before operation 525. These other elements may include, but are not limited to, the formation of spacer structures 130. The formation of these other elements is within the spirit and the scope of this disclosure.

Figure 8A:
FIGS. 8A and 8B are flow charts of a fabrication method for the formation of bilayer isolation structures in CFETs, in accordance with some embodiments.
Figure 8B:
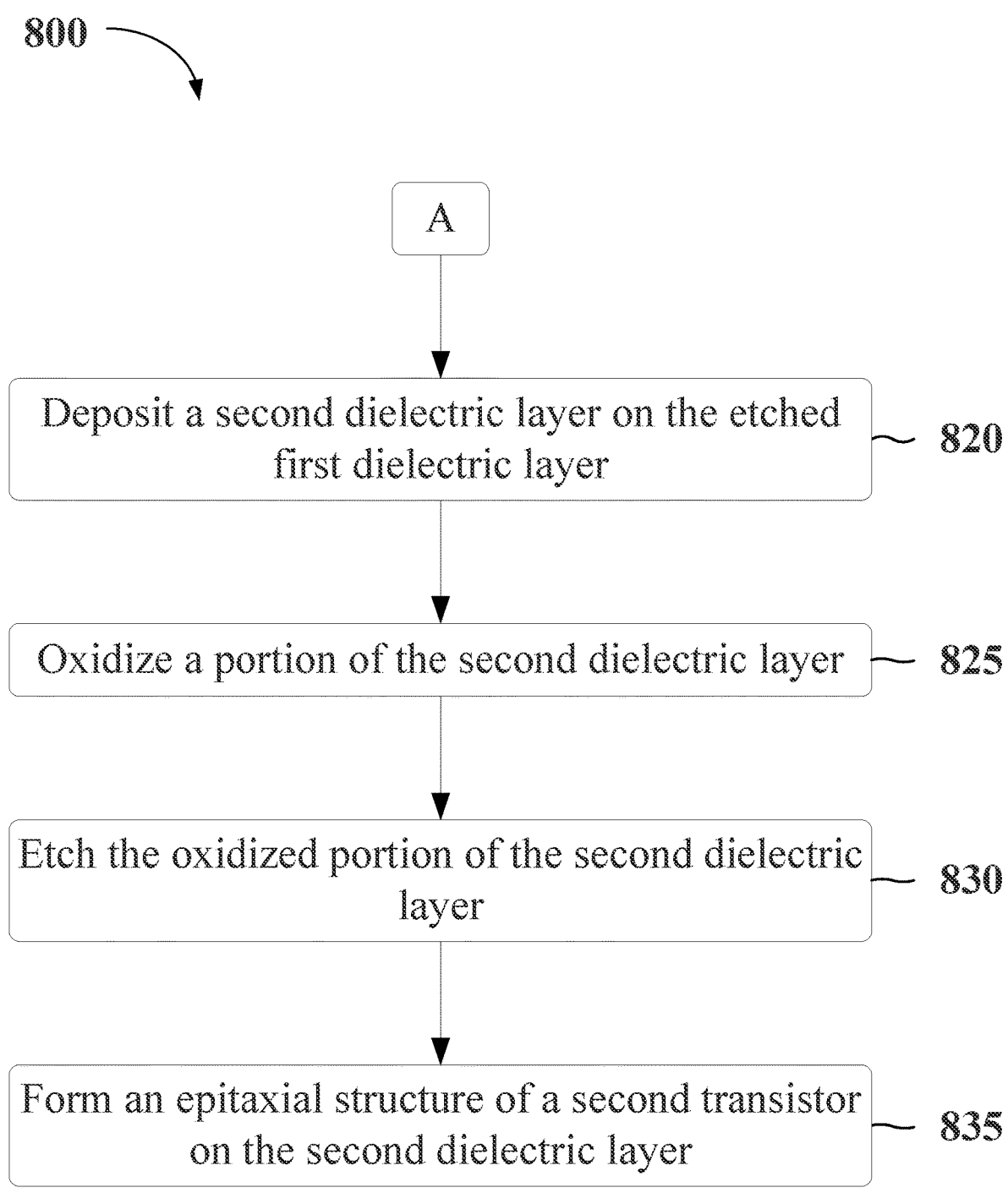

According to some embodiments, FIGS. 8A and 8B are flow charts of a fabrication method 800. In method 800, the first and second dielectric layers are deposited and partially oxidized. Subsequently, the oxidized portions of the first and second dielectric layers are etched and the un-etched portions form isolation structures 140 shown in FIGS. 1A/B, 2A/B, and 3A/B. Other fabrication operations can be performed between the various operations of method 800 and are omitted merely for clarity. This disclosure is not limited to this operational description and additional operations may be performed. Moreover, not all operations may be required to perform the disclosure provided herein. Additionally, some of the operations may be performed simultaneously or in a different order than the ones shown in FIGS. 8A and 8B. In some embodiments, one or more other operations may be performed in place of the presently described operations. For example purposes, method 800 will be described in the context of CFET structure 100 shown in FIGS. 1A and 1B. Based on the disclosure herein, method 800 is similarly applicable to CFET structures 200 and 300 shown in FIGS. 2A/B and 3A/B. For illustrative purposes, method 800 will be described using cross-sectional views along the y-z plane, such as the view shown in FIG. 1B.

In referring to FIG. 8A, method 800 begins with operation 805 and the process of depositing an oxygen-free, first dielectric layer (e.g., first dielectric layer 140a) on epitaxial structure 130A of a first transistor, such as GAA FET A shown in FIG. 1A. In some embodiments, operation 805 is similar to operation 505 of method 500 shown in FIG. 5. For example, first dielectric layer 104a is deposited with a non-conformal process as shown in FIG. 9A, which is similar to FIG. 6A discussed above. In some embodiments, first dielectric layer 140a is deposited in an opening 900 that exposes a top surface of S/D epitaxial structure 130A. In some embodiments, opening 900, similar to opening 600, is formed in dielectric layer 150 with its sidewalls formed by S/D capping layer 165. In some embodiments, ESL 170, dielectric layer 150, and S/D capping layer 165 are formed in earlier fabrication operations.

In some embodiments, first dielectric layer 140a is a SiN layer deposited with a non-conformal deposition process so that its bottom thickness 905b is greater than its sidewall thickness 905s and top thickness 905t. For example, 605b>605s, 605t. In some embodiments, 905s is greater than 905t (e.g., 905s>905t). In some embodiments, 905s is comparable to 905t (e.g., 905s is substantially equal to 905t). In some embodiments, 905s is thinner towards the top of opening 900 and thicker towards the bottom of opening 900. In some embodiments, 905b ranges from about 25 to about 100 nm, 905s ranges from about 10 nm to about 15 nm, and 905t ranges between about 5 nm and about 10 nm.

In some embodiments, first dielectric layer 140a is deposited with a plasma-assisted deposition method, such as plasma-enhanced chemical vapor deposition (PECVD) process and a plasma-enhanced atomic layer deposition (PEALD) process. As discussed above, first dielectric layer 140a protects S/D epitaxial structures 130a from oxidation during the subsequent formation of second dielectric layer 140b in the event that second dielectric layer 140b contains oxygen. In some embodiments, the thickness of first dielectric layer 140a is adjusted so that, after subsequent oxidation and etch-back operations discussed below, the thickness of first dielectric layer 140a at the bottom of opening 900 (e.g., on S/D epitaxial structure 130A) is between about 2 nm and about 4 nm.

As discussed above, a non-conformal deposition can be achieved with the use of a growth inhibitor that selectively restricts the growth of first dielectric layer 140a on a top portion of opening 600 or with a DED approach, which selectively and intermittently removes deposited material from top portions of opening 900 during deposition.

In referring to FIG. 8a, method 800 continues with operation 810 and the process of oxidizing a portion of oxygen-free, first dielectric layer 140a. In some embodiments, the oxidation process includes a conformal or non-conformal treatment with oxygen radicals (O*) using inductively coupled plasma (ICP) or a microwave (MW) plasma. In some embodiments, the oxidation process is performed at temperatures less than about 400° C. to avoid oxidation of silicon-based elements, such as NS or NW layers 115.

In some embodiments, and in referring to FIG. 9B, the oxidation process converts portions of first dielectric layer 140a to an oxygen-rich layer 910, which can be selectively removed via an etching process in a subsequent operation. In some embodiments, the oxidized portions of first dielectric layer 140a include first dielectric layer 140a on ESL 170 and S/D capping layers 165 above S/D epitaxial structure 130A. In some embodiments, the entire first dielectric layer 104a is converted to oxygen-rich layer 910. In addition, a top portion of first dielectric layer 104a on first dielectric layer 140a is oxidized as shown in FIG. 9B. Oxygen-rich layer 910 has a thickness 915b over S/D epitaxial structure 130A, which according to some embodiments is thicker than 905t and 905s. For example, thickness 915b of oxygen-rich layer 910 ranges from about 21 nm to about 98 nm—e.g., between about 84% and about 98% of thickness 905b shown in FIG. 9A.

In referring to FIG. 8a, method 800 continues with operation 815 and the process of etching the oxidized portion of first dielectric layer 140a—e.g., oxygen-rich layer 910 shown in FIG. 9B. In some embodiments, the etching process is selective towards oxygen-rich layer 910. For example, the etching process does not substantially etch non-oxidized portions of first dielectric layer 140a, ESL 170, and S/D capping layers 165. In some embodiments, FIG. 9C shows the structure of FIG. 9B after the etching process of operation 815.

According to some embodiments, the etching process includes a wet etching process, which includes DHF with a water-to-HF ratio between about 100:1 and about 500:1. In some embodiments, the wet etching chemistry provides an etching selectivity greater than about 100:1 between oxygen-rich layer 910 and non-oxidized portions of first dielectric layer 140a. In some embodiments, dilution ratios closer to about 100:1 have higher etching rates than dilution ratios closer to about 500:1. Therefore, the dilution ratio can be selected based on thickness 915b of oxygen-rich layer 910 to achieve the desired etching rate.

Alternatively, the wet etching chemistry can include diluted sulfuric acid with hydrogen peroxide ($H_2SO_4$:$H_2O_2$) at a temperature between about 90° C. and about 110° C. in a dilution ratio between about 8:1 and about 2:1. In some embodiments, the wet etching chemistry includes a solution of ammonium hydroxide, oxygen peroxide, and water ($NH_4OH$:$H_2O_2$:$H_2O$) in a 1:1:5 ratio at a temperature between about 75° C. and about 80° C. In some embodiments, the wet etching chemistry can include a solution of hydrofluoric acid (HF) and water (HF:$H_2O$) in a ratio of 1:50 or 1:500.

In some embodiments, FIG. 9C shows FIG. 9B after the etching process of operation 815. In some embodiments, thickness 610b of first dielectric layer 140a after operation 815 is between about 2 nm and about 4 nm. In some embodiments, thickness 610b of first dielectric layer 140a after the oxidation process of operation 810 and the etching process of operation 815 is uniform across the top surface of S/D epitaxial structure 130A. In some embodiments, the oxidation process of operation 810 and the etching process of operation 815 result in a top surface for first dielectric layer 140a that is curved (e.g., concave). For example, thickness 610b may not be uniform on S/D epitaxial structure 130A along the y-direction. More specifically, an edge thickness of first dielectric layer 140a adjacent to S/D capping layers 165 can be greater than a mid-point thickness of first dielectric layer 140a. According to some embodiments, the edge thickness of first dielectric layer 140a is between about 1 nm and about 2 nm thicker than the mid-point thickness of first dielectric layer 140a. In some embodiments, the edge thickness of first dielectric layer 140a is about 50% larger than the mid-point thickness of first dielectric layer 140a.

In referring to FIG. 8B, method 800 continues with operation 820 and the process of depositing second dielectric layer 140b on the etched first dielectric layer 140a. In some embodiments, the second dielectric layer 140b includes a low-k dielectric material, such as SiCON and other suitable low-k dielectric materials containing oxygen. The term "low-k" dielectric material as used herein refers to a dielectric material with a dielectric constant (k-value) below about 3.9, which is the dielectric constant of silicon oxide. In some embodiments, layer 140b is deposited with a CVD process, a PECVD process, a PEALD process, or any other suitable process at a thickness greater than about 100 nm (e.g., about 150 mn, 200 nm, 250 nm, etc.) In some embodiments, a portion of the second dielectric layer 140b is sacrificial and will be removed in a subsequent operation.

Figure 10B:
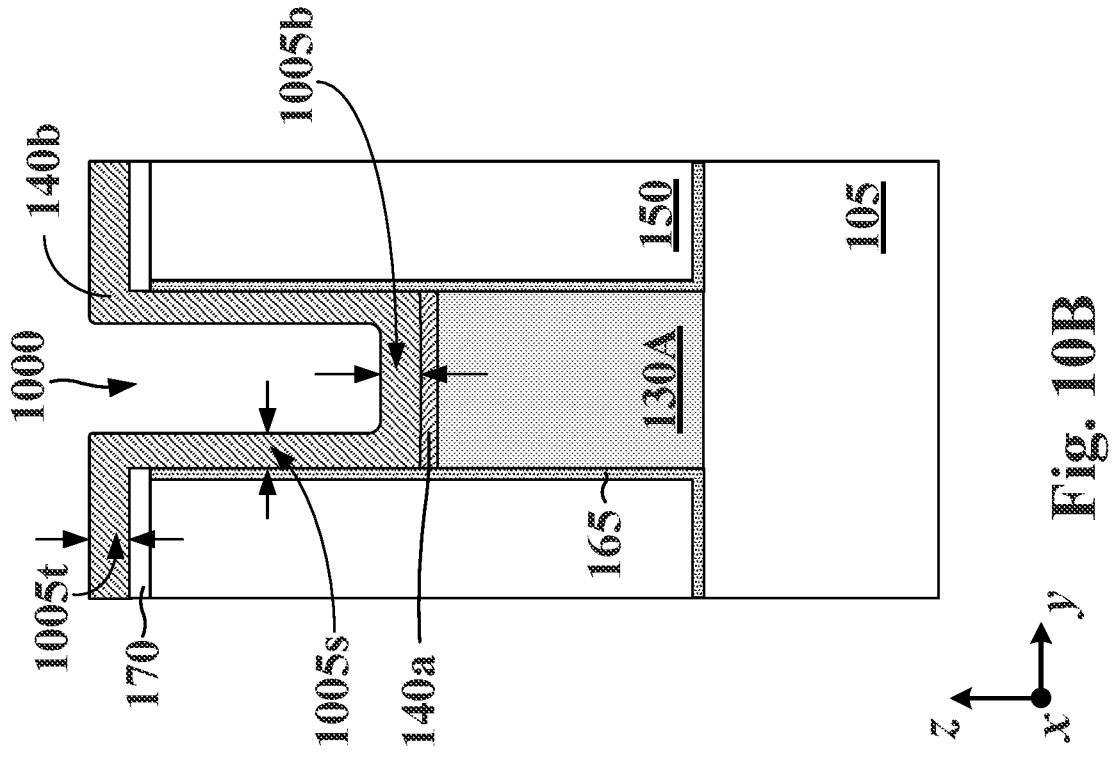
Figure 10A:
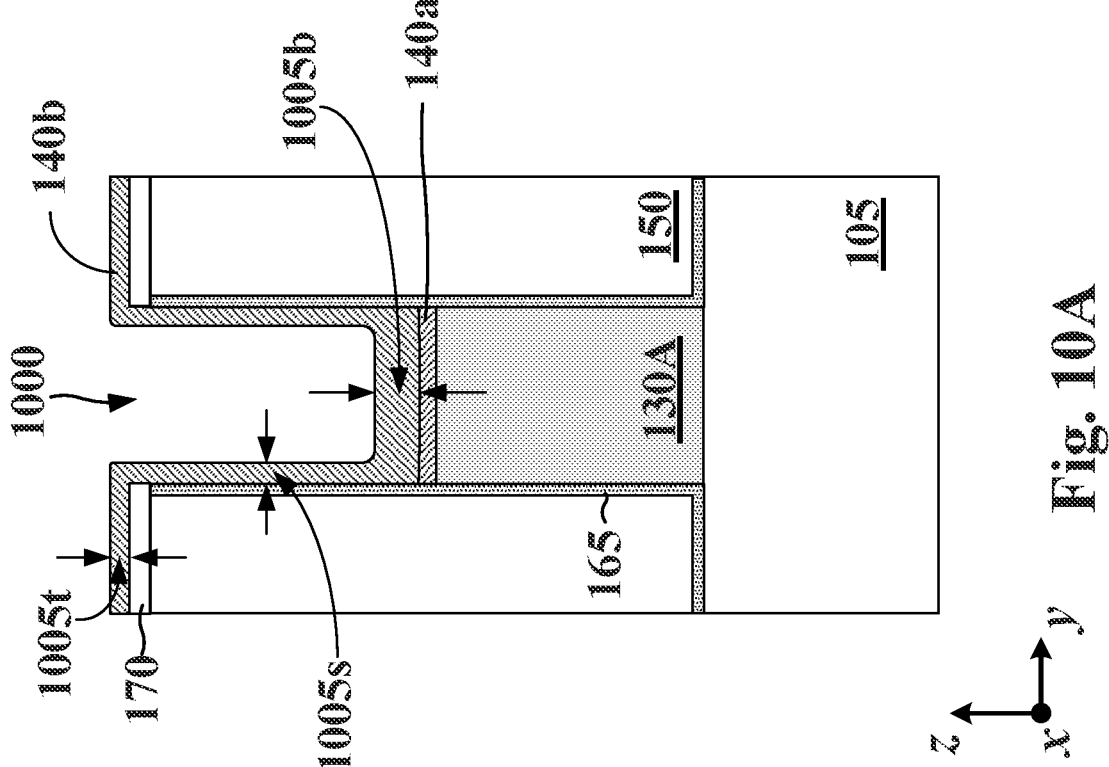

According to some embodiments, the deposition of second dielectric layer 140b can be conformal or non-conformal. For example, second dielectric layer 140b can be deposited so that its thickness is uniform along the bottom and sidewall surfaces of opening 1000 or non-uniform. For example, in a non-conformal deposition, second dielectric layer 140b can be deposited thicker on first dielectric 140a and thinner on S/D capping layers 165 and ESL 170. By way of example and not limitation, FIG. 10A shows second dielectric layer 140b deposited with a non-conformal deposition process, and FIG. 10B shows second dielectric layer 140b deposited with a conformal deposition process. As shown in FIG. 10A, bottom thickness 1005b of second dielectric layer 140b is greater than sidewall and top thickness 1005s and 1005t (e.g., 1005b>1005s, 1005t). In some embodiments, sidewall thickness 1005s is equal to or greater than top thickness 1005t (e.g., 1005s>1005t). In some embodiments, sidewall thickness 1005s is not uniform along the z-direction. For example, sidewall thickness 1005s can be thinner towards the top of opening 1000 and thicker towards the bottom of opening 1000. In contrast, and in referring to FIG. 10B, bottom thickness 1005b can be substantially equal to sidewall and top thickness 1005s and 1005t (e.g., 1005b is substantially equal to 1005s, which is substantially equal to 1005t).

As discussed above, a non-conformal deposition can be achieved with the use of a growth inhibitor that selectively restricts the growth of second dielectric layer 140b on a top portion of opening 1000 or with a DED approach, which selectively and intermittently removes deposited material from top portions of opening 1000 during deposition.

In referring to FIG. 8B, method 800 continues with operation 825 and the process of oxidizing a portion of second dielectric layer 140b. In some embodiments, the oxidation process includes a conformal or non-conformal treatment with oxygen radicals (O*) using an ICP or a MW plasma. In some embodiments, the oxidation process is performed at temperatures equal to or less than about 400° C. In some embodiments, the oxidation process of operation 825 is similar to operation 810 discussed above.

Figures 11A, 11B, 12:
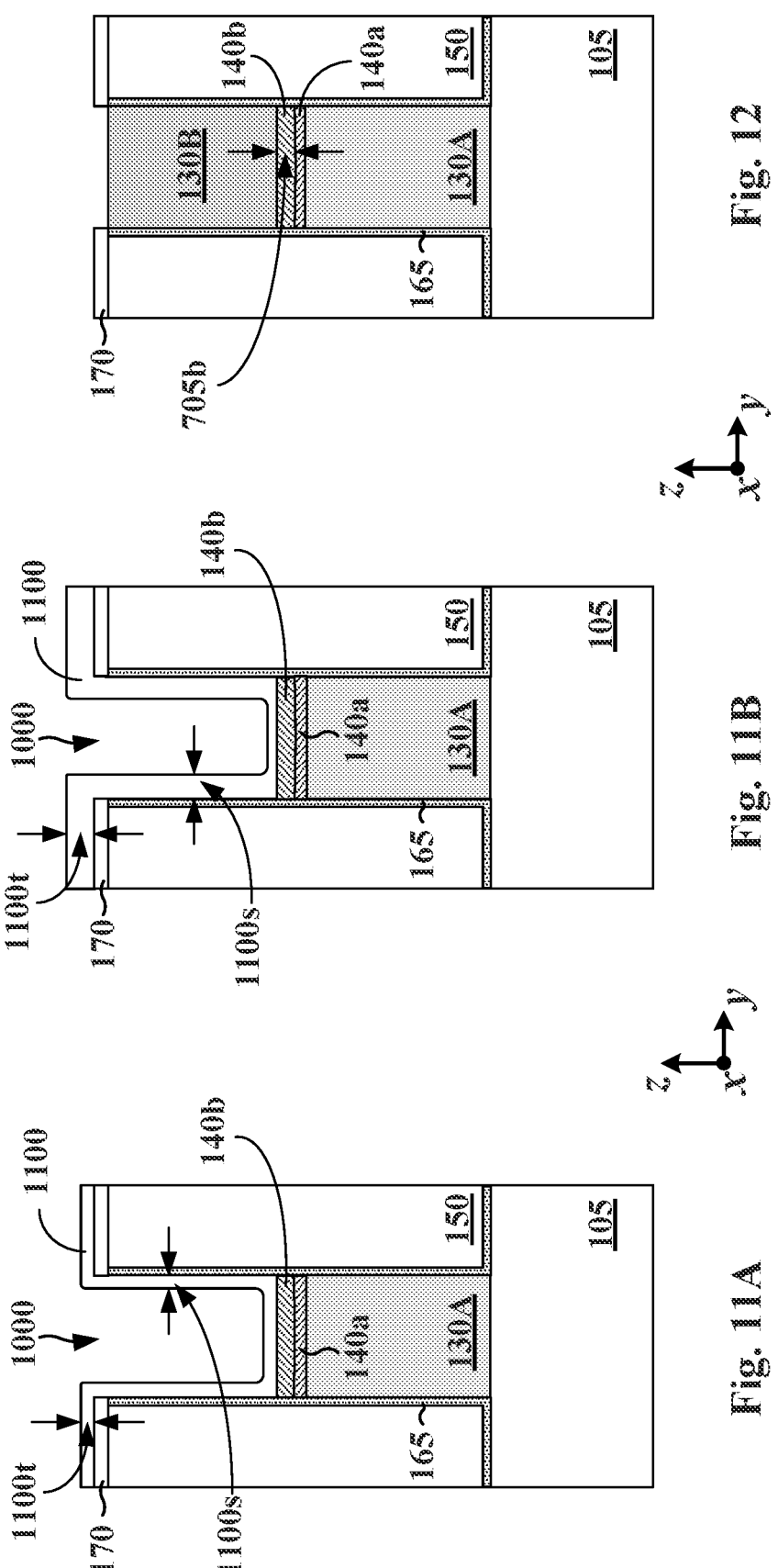

In some embodiments, and in referring to FIGS. 11A and 11B, the oxidation process converts portions of second dielectric layer 140b to an oxygen-rich layer 1100, which can be selectively removed via an etching process in a subsequent operation. In some embodiments, FIG. 11A shows the second dielectric layer 140b of FIG. 10A after operation 825, and FIG. 11B shows the second dielectric layer 140b of FIG. 10B after operation 825. By way of example and not limitation, the oxidation process for second dielectric layer 140b shown in FIG. 10A can be a conformal or a non-conformal process configured to partially oxidize thickness 1005b of second dielectric layer 140b as shown in FIG. 11A. Similarly, the oxidation process for second dielectric layer 140b shown in FIG. 10B can be a non-conformal process configured to partially oxidize thickness 1005b of second dielectric layer 140b as shown in FIG. 11B. Consequently, the oxidized portions of second dielectric layer 140b, which collectively form oxygen-rich layer 1100 in FIGS. 11A and 11B, include second dielectric layer 140b on ESL 170 and S/D capping layers 165 above S/D epitaxial structure 130A. In some embodiments, the entire second dielectric layer 104b is converted to oxygen-rich layer 1100, as shown in FIGS. 11A and 11B. In some embodiments, the portion of dielectric layer 140b on first dielectric layer 140a not oxidized by operation 825 has a thickness between about 50 nm and about 100 nm as discussed above.

In referring to FIG. 8B, method 800 continues with operation 830 and the process of etching the oxidized portion (e.g., oxygen-rich layer 1100) of second dielectric 840b. In some embodiments, the etching process is similar to the etch process used in operation 815. For example, the etching process of operation 830 can include a wet etching process with DHF having a dilution ratio between about 100:1 and about 500:1. In some embodiments, the wet etching chemistry provides an etching selectivity greater than about 100:1 between oxygen-rich layer 1100 and non-oxidized portions of second dielectric layer 140b. In some embodiments, dilution ratios closer to about 100:1 have higher etching rates than dilution ratios closer to about 500:1. Therefore, the dilution ratio can be selected based on thickness 915b of oxygen-rich layer 910 to achieve the desired etching rate. Alternatively, the wet etching chemistry can include $H_2SO_4$:$H_2O_2$ at a temperature between about 90° C. and about 110° C. in a dilution ratio between about 2:1 and about 8:1. In some embodiments, the wet etching chemistry includes $NH_4OH$:$H_2O_2$:$H_2O$ in a 1:1:5 ratio at a temperature between about 75° C. and about 80° C. In some embodiments, the wet etching chemistry can include a solution of hydrofluoric acid (HF) and water (HF:$H_2O$) in a ratio of 1:50 or 1:500.

In some embodiments, FIG. 12 shows FIGS. 11A and 11B after the etching process of operation 830. In some embodiments, thickness 705b of second dielectric layer 140b after operation 830 is between about 50 nm and about 100 nm. In some embodiments, thickness 705b of second dielectric layer 140b after the oxidation process of operation 825 and the etching process of operation 830 is uniform across the top surface of first dielectric layer 140a. In some embodiments, the oxidation process of operation 825 and the etching process of operation 830 can result in a top surface for second dielectric layer 140b that is curved (e.g., concave). For example, thickness 705b of second dielectric 140b may not be uniform on first dielectric layer 140a along the y-direction. More specifically, an edge thickness of second dielectric layer 140b adjacent to S/D capping layers 165 can be greater than a mid-point thickness of second dielectric layer 140b. According to some embodiments, the edge thickness of second dielectric layer 140b is between about 3 nm and 5 nm thicker than the mid-point thickness, which can range between about 17 nm and about 93 nm.

In referring to FIG. 8B, method 800 continues with operation 835 and the process of forming an epitaxial structure (e.g., S/D epitaxial structure 130B) of a second transistor (e.g., second transistor B shown in FIG. 1A) on second dielectric layer 140b. In some embodiments, S/D epitaxial structure 130B is grown directly on second dielectric layer 140b without the presence of intermediate layers as shown in FIG. 12.

Figure 14:
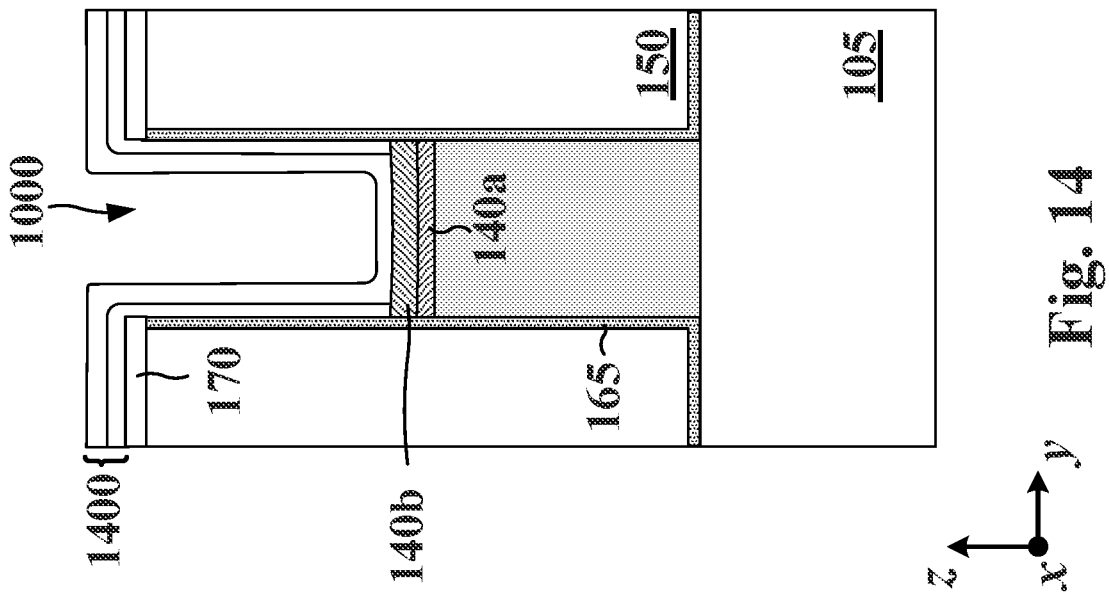
FIGS. 13-16 are cross-sectional views of intermediate structures during the fabrication of bilayer isolation structures in CFETs, in accordance with some embodiments.
Figure 13:
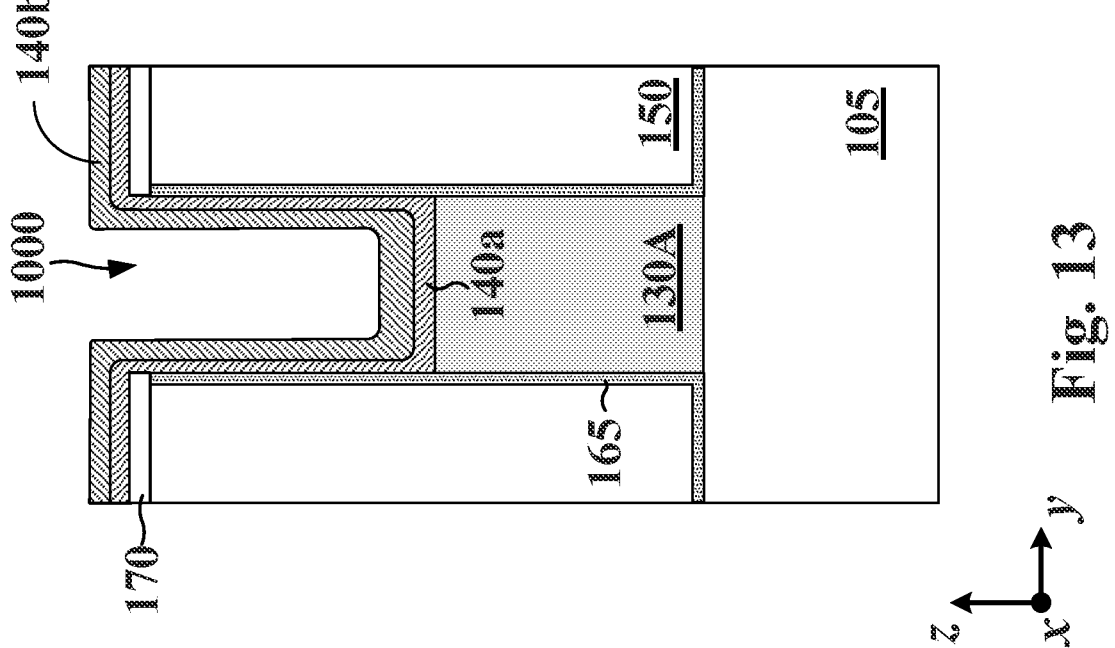
Figure 16:
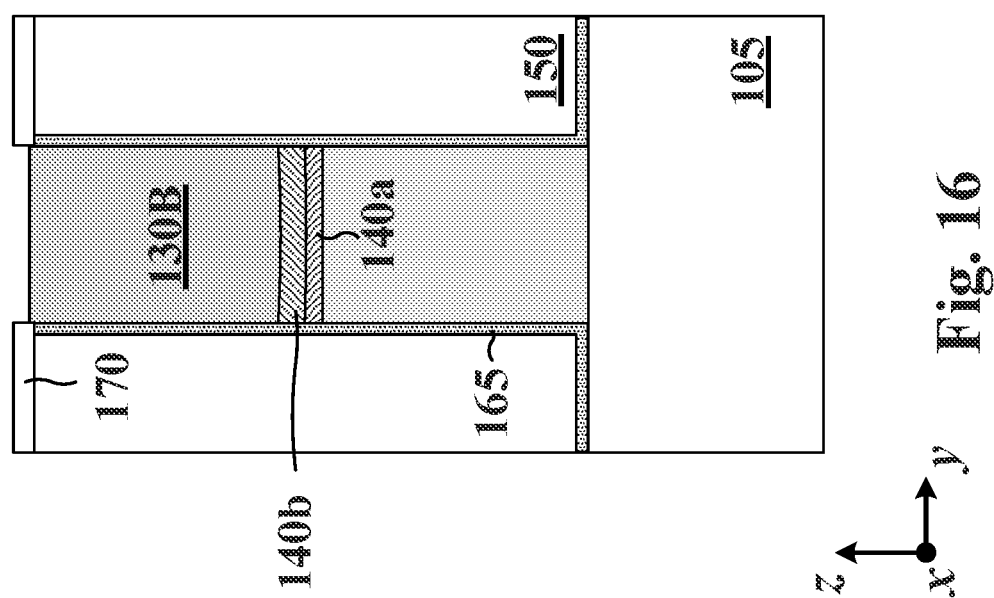
Figure 15:
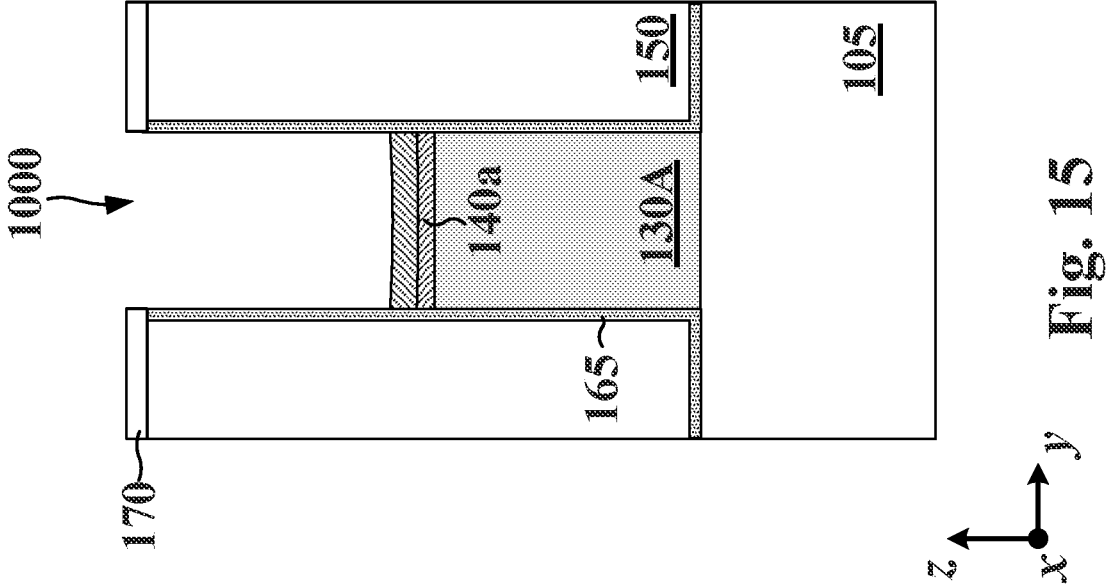

In some embodiments, method 800 can be modified so that a conformal first dielectric layer 140a with a thickness between about 2 nm and about 4 nm is deposited during operation 805. Subsequently, operations 810 and 815 are omitted and second dielectric layer 140b is deposited according to operation 820 on first dielectric layer 140a as shown in FIG. 13. Operation 825 can be modified so that portions of both first and second dielectric layers 140a and 140b are subjected to a selective oxidation process to form oxygen-rich layer 1400 as shown in FIG. 14. For example, a non-conformal oxidation process can be configured to form oxygen-rich layer 1400 from selected portions of first and second dielectric layers 140a and 140b. Non-oxidized portions of first and second dielectric layers 140a and 140b remain on S/D epitaxial structure 130A as shown in FIG. 14. As discussed above, the non-conformal oxidation process can include a treatment with oxygen radicals (O*) using an ICP or a MW plasma. The oxidation process is performed at a temperature equal to or less than about 400° C. Subsequently, oxygen-rich layer 1400 is selectively removed with an etching process similar to the one described in operation 830 as shown in FIG. 15, and S/D epitaxial structure 130b can be grown on second dielectric layer 140b according to operation 835 as shown in FIG. 16.

Figure 17:
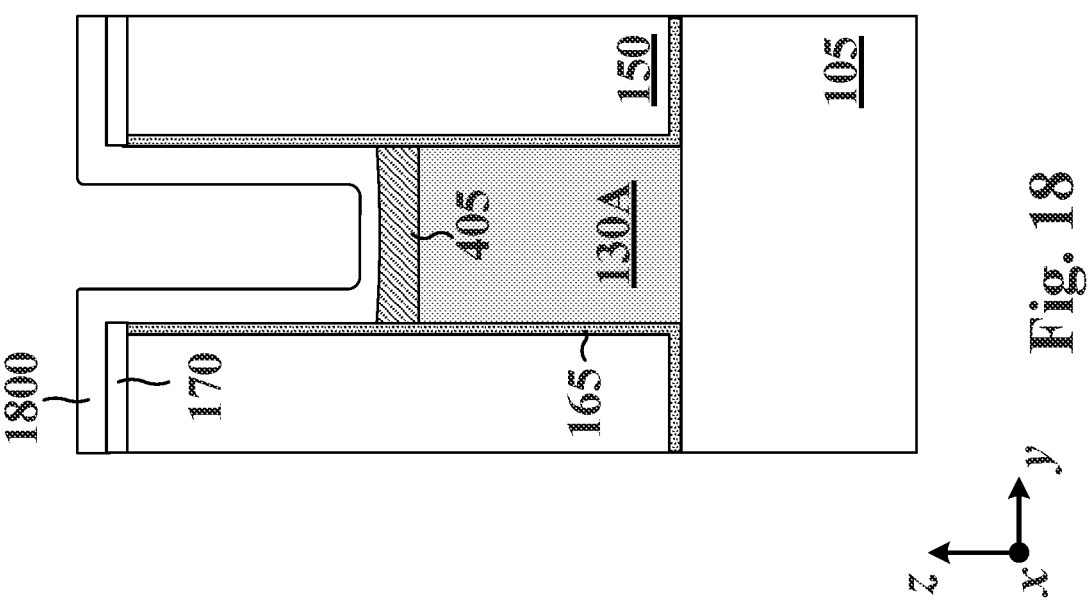
FIGS. 17-20 are cross-sectional views of intermediate structures during the fabrication of single layer isolation structures in CFETs, in accordance with some embodiments.

In some embodiments, first and second dielectric layers 140a and 140b can be replaced with a single, oxygen-free, low-k dielectric layer 405 ("layer 405") that forms isolation structures 400 shown in FIGS. 4A and 4B. In some embodiments, layer 405 includes BN, SiBCN, SiCN, or suitable dielectric deposited with a PECVD, PEALD, or a CVD process. In some embodiments, layer 405 can be deposited conformally or non-conformally similar to first and second dielectric layers 140a and 140b discussed above. By way of example and not limitation, FIG. 17 shows a layer 405 non-conformally deposited in opening 1700. For example, in FIG. 17, layer 405 is deposited thicker on top of S/D epitaxial layer 130A and thinner on S/D capping layers 165 and ESL 170.

Figure 18:
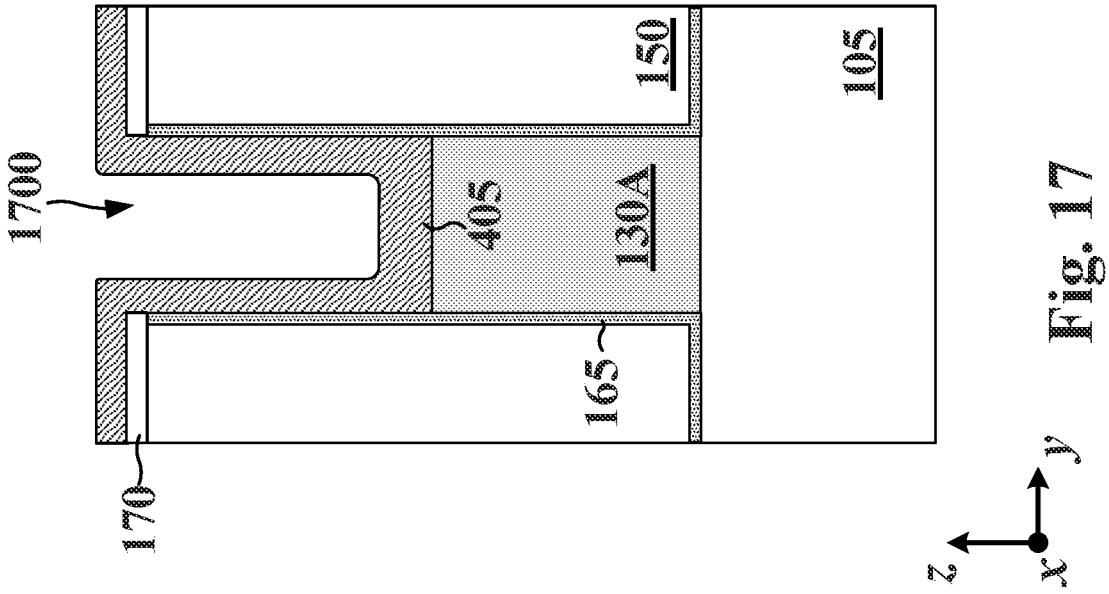
Figure 20:
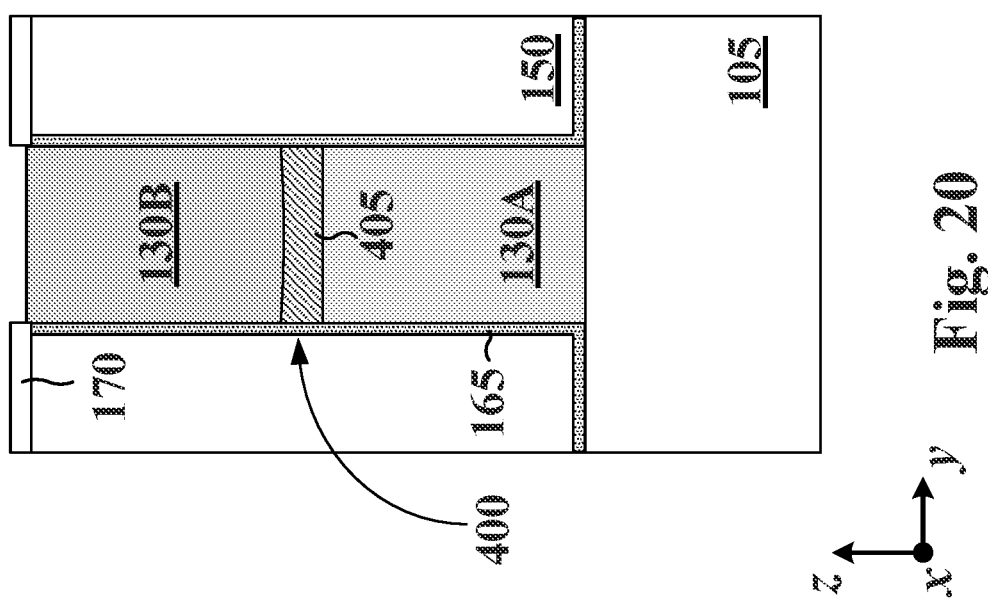
Figure 19:
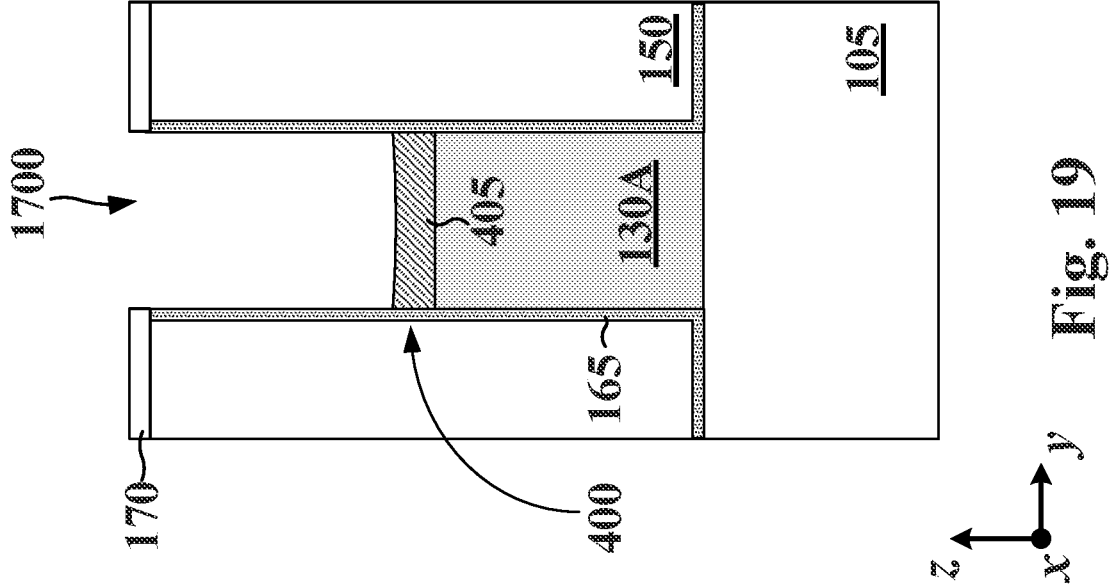

Subsequently, layer 405 can be partially oxidized with a conformal or non-conformal process to form oxygen-rich layer 1800 so that the non-oxidized portion of layer 405 remaining on the top surface of S/D epitaxial structure 130A has a thickness between about 52 nm and about 104 nm. In some embodiments, the oxidation process can be similar to the oxidation processes described above with respect to operations 810 and 825 of method 800. As shown in FIG. 18, oxygen-rich layer 1800 covers ESL 170 and a portion of S/D capping layers 165. An etching process, similar to the etching process described above with respect to operations 815 and 830 can be used to selectively remove oxygen-rich layer 1800 as shown in FIG. 19. Subsequently, S/D epitaxial structure 130B can be formed on layer 405 as shown in FIG. 20.

As described above with respect to second dielectric layer 140b, the oxidizing and etching operations can result in a layer 405 with a uniform or a non-uniform thickness over S/D epitaxial structure 130A. For example, in FIG. 20, layer 405 can have a concave top surface—e.g., thicker towards S/D capping layers 165 and thinner towards the middle.

In some embodiments, single layer isolation structure 400 can be used to reduce the number of fabrication operations, while dual layer isolation structure 140 can be used when an oxygen containing second dielectric is desirable. The embodiments described herein are directed to methods for the fabrication of isolation structures between the S/D epitaxial structures of vertically stacked transistors in CFET structures. In some embodiments, the isolation structures described herein are applicable to CFET structures that include GAA FETs or a combination of GAA FETs and finFETs. In some embodiments, the isolation structures include a bilayer stack of an oxygen-free bottom layer and a SiO$_2$ top layer. In some embodiments, the isolation structures include a bilayer stack of an oxygen-free bottom layer and a low-k, oxygen-containing top layer. In some embodiments, the isolation structures include a low-k, oxygen-free, single layer. In some embodiments, the oxygen-free bottom layer is thinner than the SiO$_2$ or oxygen-containing top layer. In some embodiments, the fabrication of the isolation structures includes a deposition process followed by a dry etching process. In some embodiments, the fabrication of the isolation structures includes a deposition process, a post-deposition treatment (e.g., an oxidation process), and an etching process. In some embodiments, the isolation structures include dielectric layers selected from SiO$_2$, SiN, SiCN, SiCON, SiBCN, BN, or combinations thereof.

In some embodiments, structure includes a substrate, a first transistor with first S/D epitaxial structures on the substrate and a second transistor on the first transistor, where the second transistor includes second S/D epitaxial structures aligned with the first S/D epitaxial structures of the first transistor. The structure further includes an isolation structure interposed between the first and second S/D epitaxial structures and a capping layer surrounding sidewalls of the first and second S/D epitaxial structures and the isolation structure.

In some embodiments, a method includes forming a first transistor with first S/D epitaxial structures on a substrate, depositing an oxygen-free dielectric on the first S/D epitaxial structures, oxidizing a top portion of the oxygen-free dielectric, and etching the oxidized top portion of the oxygen-free dielectric to form a first layer. The method further includes depositing an oxygen-containing dielectric on the first layer, oxidizing a top portion of the oxygen-containing dielectric 1100, and etching the oxidized top portion of the oxygen-containing dielectric 1100 to form a second layer. The method also includes forming second transistor on the first transistor, where the second transistor includes second S/D epitaxial structures formed on the first S/D epitaxial structures so that the first and second S/D epitaxial structures are separated by the first and second layers.

In some embodiments, a method includes depositing an oxygen-free dielectric material in an opening over a first epitaxial structure, where the oxygen-free dielectric material covers top surfaces of the first epitaxial structure and sidewall surfaces of the opening. The method also includes exposing the oxygen-free dielectric material to an oxidizing process to oxidize the oxygen-free dielectric material so that the oxidizing process does not oxidize a portion of the oxygen-free dielectric material on the first epitaxial structure. Further, etching the oxidized oxygen-free dielectric material and forming a second epitaxial layer on the oxygen-free dielectric material not removed by the etching to substantially fill the opening.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a substrate;
a first transistor on the substrate, wherein the first transistor comprises inner spacers and first source/drain (S/D) epitaxial structures in contact with the inner spacers;
a second transistor on the first transistor, wherein the second transistor comprises second S/D epitaxial structures aligned with the first S/D epitaxial structures of the first transistor;
an isolation structure interposed between the first and second S/D epitaxial structures; and
a capping layer surrounding the first and second S/D epitaxial structures and the isolation structure along a first horizontal direction and a second horizontal direction perpendicular to the first horizontal direction.

2. The structure of claim 1, wherein the isolation structure has a concave top surface topography.

3. The structure of claim 1, wherein the isolation structure has a planar top surface topography.

4. The structure of claim 1, wherein the isolation structure comprises:
a first layer comprising an oxygen-free dielectric; and
a second layer, on the first layer, comprising an oxygen-containing dielectric, wherein the second layer has a lower dielectric constant than the first layer.

5. The structure of claim 4, wherein the first layer is thinner than the second layer.

6. The structure of claim 4, wherein the oxygen-free dielectric comprises silicon nitride and the oxygen-containing dielectric comprises silicon oxide or silicon oxy-carbon nitride.

7. The structure of claim 1, wherein the capping layer comprises first and second portions, and wherein the first and second transistors and the isolation structure are between the first and second portions.

8. The structure of claim 1, wherein the first transistor further comprises a channel layer, and wherein a top surface of the channel layer is coplanar with a bottom surface of the isolation structure.

9. The structure of claim 1, wherein the first horizontal direction is perpendicular to the second horizontal direction.

10. A structure, comprising:
a first epitaxial structure on a substrate;
a first stack structure adjacent to the first epitaxial structure;

an isolation structure on the first epitaxial structure, wherein the isolation structure comprises a first dielectric layer and a second dielectric layer on the first dielectric layer, wherein the first dielectric layer is oxygen free, and wherein a thickness of the second dielectric layer is greater than a thickness of the first dielectric layer;
an other isolation layer on the first stack structure, wherein a bottom surface of the other isolation layer is coplanar with a bottom surface of the first dielectric layer; and
a second epitaxial structure on the isolation structure, wherein an interface between the second epitaxial structure and the isolation structure is curved.

11. The structure of claim 10, further comprising a capping layer extending continuously over sidewalls of the first and second epitaxial structures and a top surface of the substrate.

12. The structure of claim 10, wherein a first side surface of the first epitaxial structure is coplanar with a second side surface of the second epitaxial structure.

13. The structure of claim 10, further comprising a second stack structure adjacent to the second epitaxial structure, wherein each of the first and second stack structures comprises a gate structure and a nano-sheet structure, and wherein the gate structure surrounds the nano-sheet structure.

14. The structure of claim 13, wherein the other isolation layer is between the first and second stack structures.

15. A structure, comprising:
a first epitaxial structure on a substrate;
a dielectric layer, comprising:
a first layer on the first epitaxial structure and comprising an oxygen-free layer and a planar top surface; and
a second layer on the planar top surface of the first layer and comprising a curved top surface, wherein the second layer has a lower dielectric constant than a dielectric constant of the first layer; and
a second epitaxial structure on the dielectric layer.

16. The structure of claim 15, wherein a first side surface of the first epitaxial structure is coplanar with a second side surface of the second epitaxial structure.

17. The structure of claim 15, wherein the second layer comprises oxygen.

18. The structure of claim 15, further comprising a capping layer surrounding side surfaces of the dielectric layer and the first and second epitaxial structures.

19. The structure of claim 15, wherein a thickness of the first layer is between about 2 nm and about 4 nm.

20. The structure of claim 15, wherein a thickness of the first layer is less than a thickness of the second layer.

* * * * *